(12) United States Patent
Hung et al.

(10) Patent No.: US 12,310,096 B2
(45) Date of Patent: May 20, 2025

(54) METHOD FOR FABRICATING SEMICONDUCTOR STRUCTURE WITH CUTTING DEPTH CONTROL

(71) Applicant: TAIWAN SEMICONDUCTOR MANUFACTURING CO., LTD., Hsinchu (TW)

(72) Inventors: Chih-Chang Hung, Hsinchu (TW);
Shu-Yuan Ku, Hsinchu County (TW);
I-Wei Yang, Yilan County (TW);
Yi-Hsuan Hsiao, Taipei (TW);
Ming-Ching Chang, Hsinchu (TW);
Ryan Chia-Jen Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/338,162

(22) Filed: Jun. 20, 2023

(65) Prior Publication Data

US 2023/0335442 A1 Oct. 19, 2023

Related U.S. Application Data

(60) Continuation of application No. 17/341,163, filed on Jun. 7, 2021, now Pat. No. 11,721,588, which is a
(Continued)

(51) Int. Cl.
*H10D 84/03* (2025.01)
*H01L 21/762* (2006.01)
(Continued)

(52) U.S. Cl.
CPC ..... *H10D 84/038* (2025.01); *H01L 21/76224* (2013.01); *H10D 30/024* (2025.01); *H10D 30/62* (2025.01); *H10D 64/017* (2025.01); *H10D 84/0158* (2025.01); *H10D 84/834* (2025.01); *H10D 84/0151* (2025.01)

(58) Field of Classification Search
CPC ....... H01L 21/76224; H01L 21/823431; H01L 21/823481; H01L 27/0886; H01L 29/66545; H01L 29/66795
See application file for complete search history.

(56) References Cited

U.S. PATENT DOCUMENTS 9,331,074 B1 5/2016 Chang
10,163,640 B1 12/2018 Hsieh
(Continued)

*Primary Examiner* — Herve-Louis Y Assouman
*Assistant Examiner* — Christopher M Roland
(74) *Attorney, Agent, or Firm* — Maschoff Brennan

(57) ABSTRACT

A method incudes forming first and second semiconductor fins upwardly extending from a substrate; forming a gate strip extending across the first and second semiconductor fins; growing first source/drain regions on the first semiconductor fin and at opposite sides of the gate strip, second source/drain regions on the second semiconductor fin and at opposite sides of the gate strip; depositing a dielectric layer over the first and second source/drain regions; forming an isolation material in the dielectric layer and between one of the first source/drain regions and one of the second source/drain regions; performing an etching process on the isolation material and the gate strip to form an opening, the opening breaking the grid strip and recessing the isolation material; forming a separation material in the opening.

20 Claims, 24 Drawing Sheets

Related U.S. Application Data division of application No. 15/876,175, filed on Jan. 21, 2018, now Pat. No. 11,031,290.

(60) Provisional application No. 62/593,055, filed on Nov. 30, 2017.

(51) Int. Cl.
*H10D 30/01* (2025.01)
*H10D 30/62* (2025.01)
*H10D 64/01* (2025.01)
*H10D 84/01* (2025.01)
*H10D 84/83* (2025.01)

(56) References Cited

U.S. PATENT DOCUMENTS

| | | |
|---|---|---|
| 2015/0144998 A1 | 5/2015 | Ching |
| 2015/0325482 A1 | 11/2015 | Hu |
| 2016/0111336 A1 | 4/2016 | Chang |
| 2016/0133632 A1 | 5/2016 | Park |
| 2017/0084463 A1 | 3/2017 | Greene |
| 2017/0125411 A1 | 5/2017 | Yu et al. |
| 2017/0125441 A1 | 5/2017 | Yu |
| 2018/0182859 A1 | 6/2018 | Lee |
| 2018/0277440 A1 | 9/2018 | Yu |
| 2019/0006345 A1 | 1/2019 | Wang |
| 2019/0013245 A1 | 1/2019 | Jha |
| 2019/0067301 A1 | 2/2019 | Yang |
| 2019/0148539 A1 | 5/2019 | Yang |
| 2019/0157135 A1 | 5/2019 | Ku |
| 2019/0164839 A1 | 5/2019 | Tsai |
| 2020/0144118 A1 | 5/2020 | Cheng |

METHOD FOR FABRICATING SEMICONDUCTOR STRUCTURE WITH CUTTING DEPTH CONTROL

RELATED APPLICATION

The present application is a Continuation application of the U.S. application Ser. No. 17/341,163, filed Jun. 7, 2021, which is a Divisional application of the U.S. application Ser. No. 15/876,175, filed Jan. 21, 2018, now U.S. Pat. No. 11,031,290, issued Jun. 8, 2021, which claims priority to U.S. Provisional Application Ser. No. 62/593,055, filed Nov. 30, 2017, which is herein incorporated by reference in their entirety.

BACKGROUND

In semiconductor technology, a semiconductor wafer experiences several treatment operations for forming specific semiconductor elements (e.g. source/drain devices, gate structure, isolations, interconnects or the like), thereby achieving the desired effects or functions. Further, in order to package and produce semiconductor chips, a cut operation is performed on the semiconductor wafer. However, as technology node sizes decrease and integrated circuit dimensions are scaled down, critical dimension requirements of the cut operation become more stringent. Besides, the semiconductor elements are easily damaged by an etchant during the cut operation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1O is a schematic cross-sectional view of the semiconductor device along a line C-C' in FIG. 1N in accordance with some embodiments of the present disclosure. FIG. 1O(A) is a schematic cross-sectional view of the semiconductor device along a line C-C' in FIG. 1N in accordance with some embodiments of the present disclosure.

FIG. 1Q(A) is a schematic cross-sectional view of the semiconductor device along a line E-E' in FIG. 1N in accordance with some embodiments of the present disclosure.

DETAILED DESCRIPTION

Figure 1A:
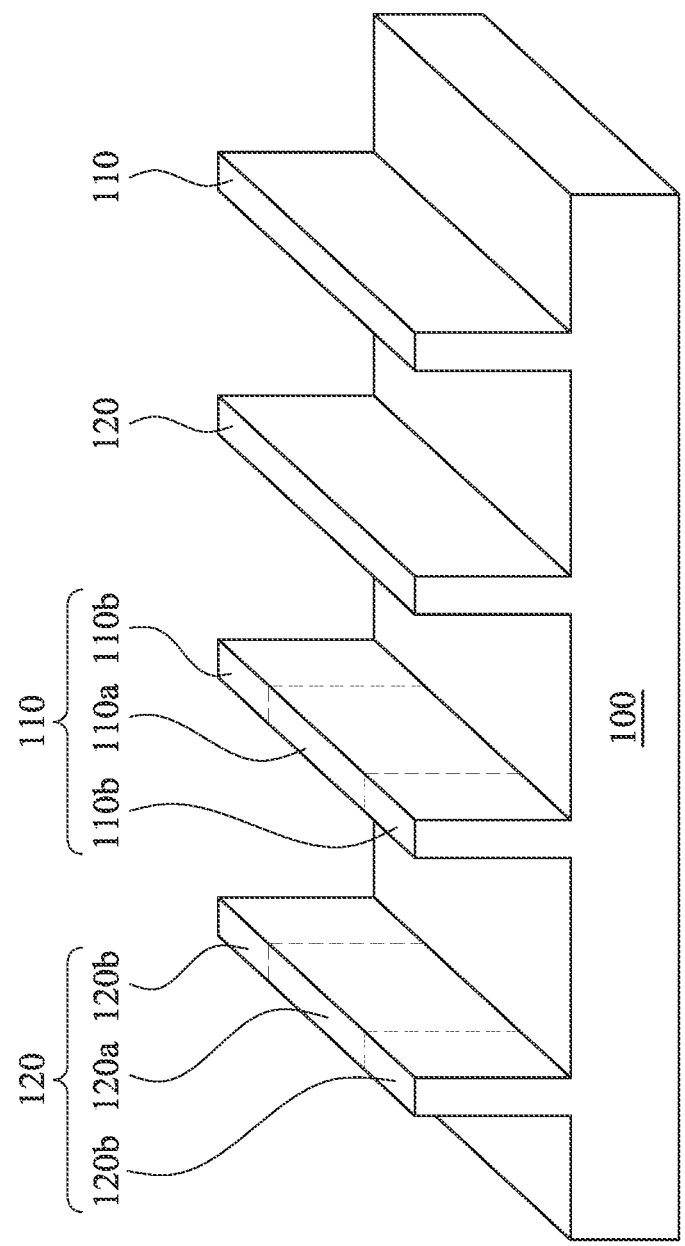
FIG. 1A to FIG. 1G are schematic perspective views of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Typically, each of fins protruding from a substrate has a gate region and a source/drain region. A metal gate structure is located over and around the gate regions, and source/drain devices are formed on the source/drain regions. Further, an inter-layer dielectric layer is deposited between the source/drain devices. During a following metal gate cut operation, a cut region on which the metal gate cut operation is performed is located between the adjacent fins and intersects the metal gate structure, thereby forming an opening in the metal gate structure and the inter-layer dielectric layer adjacent to the metal gate structure. However, the inter-layer dielectric layer has a same etching amount as the metal gate structure during the metal gate cut operation. Accordingly, the source/drain devices underlying the cut region are easily damaged by an etchant during the metal gate cut operation.

Embodiments of the present disclosure are directed to a semiconductor structure with cutting depth control and a method for fabricating the semiconductor structure. The present disclosure provides a method for preventing source/drain devices from being damaged by a metal gate cut operation. Before the metal gate cut operation is performed, a portion of an inter-layer dielectric layer is replaced by an isolation material, thereby forming an isolation portion adjacent to a metal gate structure. An etchant of the metal gate cut operation has a lower etching selectivity with respect to the isolation material than to a material forming the metal gate structure, such that an opening formed in the isolation portion has a smaller depth than an opening formed in the metal gate structure after the metal gate cut operation is performed. Accordingly, the source/drain devices are not damaged by the etchant. Furthermore, the semiconductor structure of the present disclosure has the isolation portion disposed in the inter-layer dielectric layer, thereby blocking and preventing the etchant applied in the metal gate cut operation from excessively etch, thus simultaneously meeting cutting requirements of integrated circuit dimensions.

Referring to FIG. 1A to FIG. 1G, FIG. 1A to FIG. 1G are schematic perspective views of a semiconductor device in accordance with some embodiments of the present disclosure. At first, as shown in FIG. 1A, a substrate 100 is provided. In some embodiments, the substrate 100 may be a semiconductor substrate such as a silicon substrate. The substrate 100 includes various layers including conductive or insulating layers formed on a semiconductor substrate. In some embodiments, the substrate 100 includes various doping configurations depending on design requirements. In some embodiments, the substrate 100 includes a suitable semiconductor, such as germanium; a suitable compound semiconductor, such as silicon carbide, gallium nitride, gallium arsenide, or indium phosphide; or a suitable alloy semiconductor, such as silicon germanium, silicon tin, aluminum gallium arsenide, or gallium arsenide phosphide. In some embodiments, the substrate includes an epitaxial layer (epi-layer), the substrate may be strained for performance enhancement, the substrate may include a silicon-on-insulator (SOI) structure, and/or the substrate may have other suitable enhancement effects.

As shown in FIG. 1A, first fins 110 and second fins 120 are alternately formed on the substrate 100 and protrude from the substrate 100. The first fins 110 and the second fins 120 include silicon or a suitable elementary semiconductor, such as germanium; a suitable compound semiconductor, such as silicon carbide, gallium arsenide, gallium phosphide, indium phosphide, indium arsenide, and/or indium antimonide; a suitable alloy semiconductor, such as SiGe, GaAsP, AlInAs, AlGaAs, InGaAs, GaInP or GaInAsP; and/or a combination thereof. First fins 110 and second fins 120 are fabricated by suitable operations including lithography operation and etching operation. In some embodiments, the lithography operation includes forming a resist layer over the substrate, patterning the resist layer and developing the patterned resist layer, thereby forming a mask over the substrate. In some embodiments, the operation of patterning the resist layer is performed by an extreme ultraviolet (EUV) lithography operation or an electron beam (e-beam) lithography operation. The patterned mask can protect the substrate during the etching operation, thereby forming protruding fins. In some embodiments, the etching operation is performed by a dry etching, a wet etching, other suitable etching operations, and/or a combination thereof.

Each of the first fins 110 is divided into a first gate region 110a and first source/drain regions 110b, and the first gate region 110a is located between the source/drain regions 110b. Each of the second fins 120 is divided into a second gate region 120a and second source/drain regions 120b, and the second gate region 120a is located between the source/drain regions 120b.

Figure 1B:
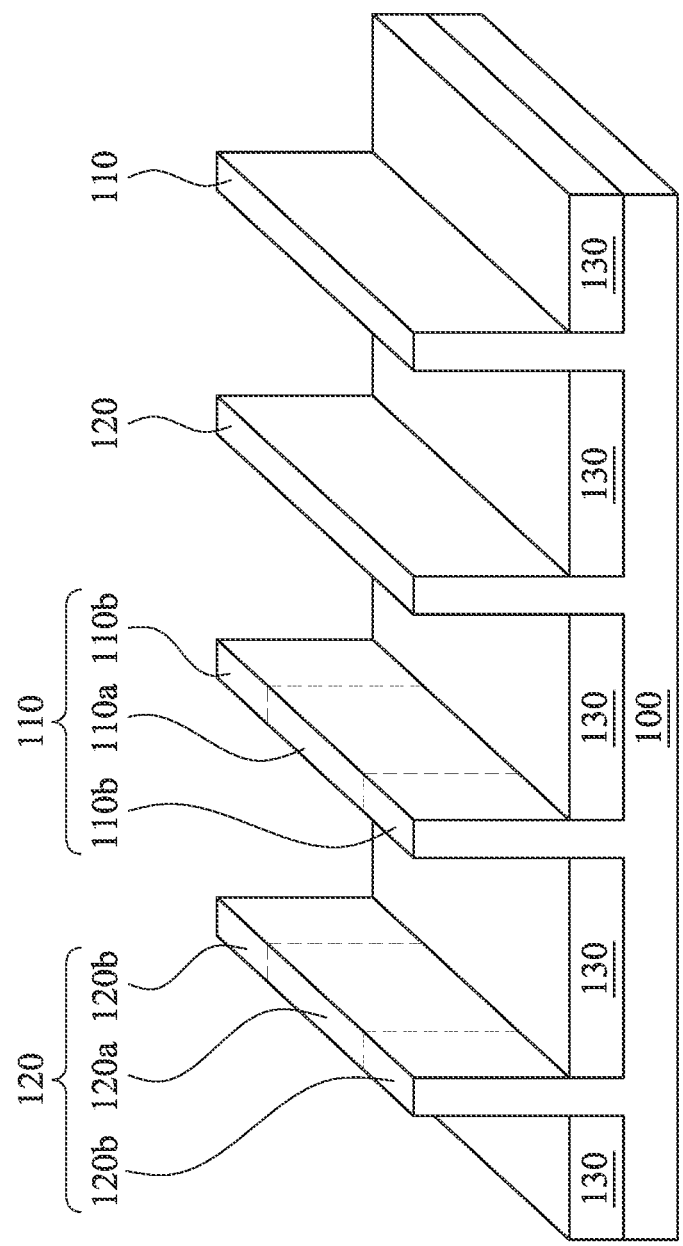

As shown in FIG. 1B, trench isolations 130 are formed between the first fins 110 and the second fins 120. In some embodiments, the trench isolations 130 include shallow trench isolations (STI), field oxide, local oxidation of silicon (LOCOS), other suitable isolations, and/or a combination thereof. In some embodiments, the trench isolations 130 include a low-k dielectric material. In some embodiments, the trench isolation material includes silicon oxide, silicon nitride, silicon oxynitride, fluorine-doped silicate glass (FSG), other suitable isolation materials, and/or a combination thereof.

Figure 1C:
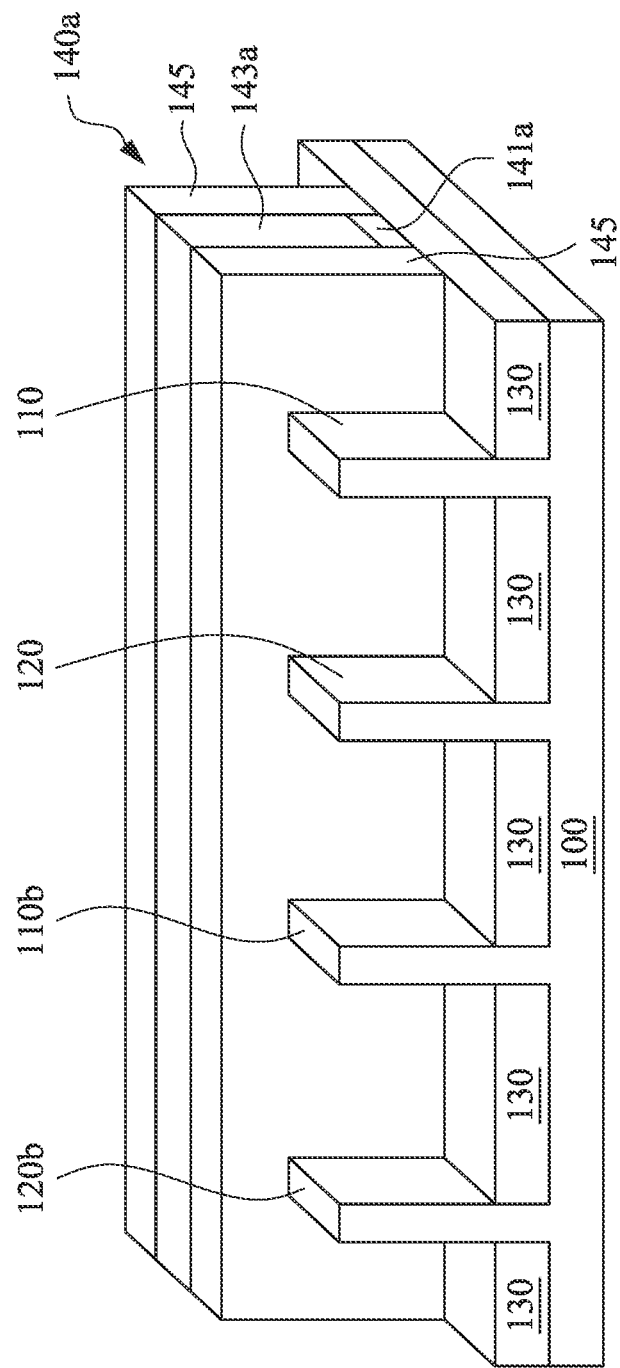

As shown in FIG. 1B and FIG. 1C, a dummy gate structure 140a is formed over and around the first gate regions 110a and the second gate regions 120a (i.e. the dummy gate structure 140a wraps a channel region of the semiconductor device). The dummy gate structure 140a extends from the first fin 110 to the second fin 120. The dummy gate structure 140a includes a dummy gate stack (not labeled) and sidewall spacers 145 formed on sidewalls of the dummy gate stack. The dummy gate stack includes a gate insulating layer 141a and a poly silicon layer 143a formed on the gate insulating layer 141a, and the gate insulating layer 141a is formed on the first gate region 110a and the second gate region 120a. In some embodiments, the gate insulating layer 141a is made from silicon oxide. In some embodiments, the gate insulating layer 141a is formed by chemical vapor deposition (CVD), physical vapor deposition (PVD), atomic layer deposition (ALD), electron beam (e-beam) evaporation, other suitable operations, and/or a combination thereof. In some embodiments, the poly silicon layer 143a is formed by patterning operation. The sidewall spacers 145 include a dielectric material. In some embodiments, the sidewall spacers 145 include silicon oxide, silicon nitride, silicon carbide, silicon carbonitride, silicon oxynitride, silicon oxycarbonitride, other suitable dielectric materials, and/or a combination thereof.

In some embodiments, after the dummy gate structure 140a is formed, a contact-etch stop layer (CESL) is optionally formed over the dummy gate structure 140a. In some embodiments, the CESL layer is made of one or more layers of silicon oxide or silicon nitride based materials such as silicon oxide, silicon nitride, silicon carbonitride, silicon oxynitride, silicon oxycarbonitride, other suitable dielectric materials, and/or a combination thereof.

Figure 1D:
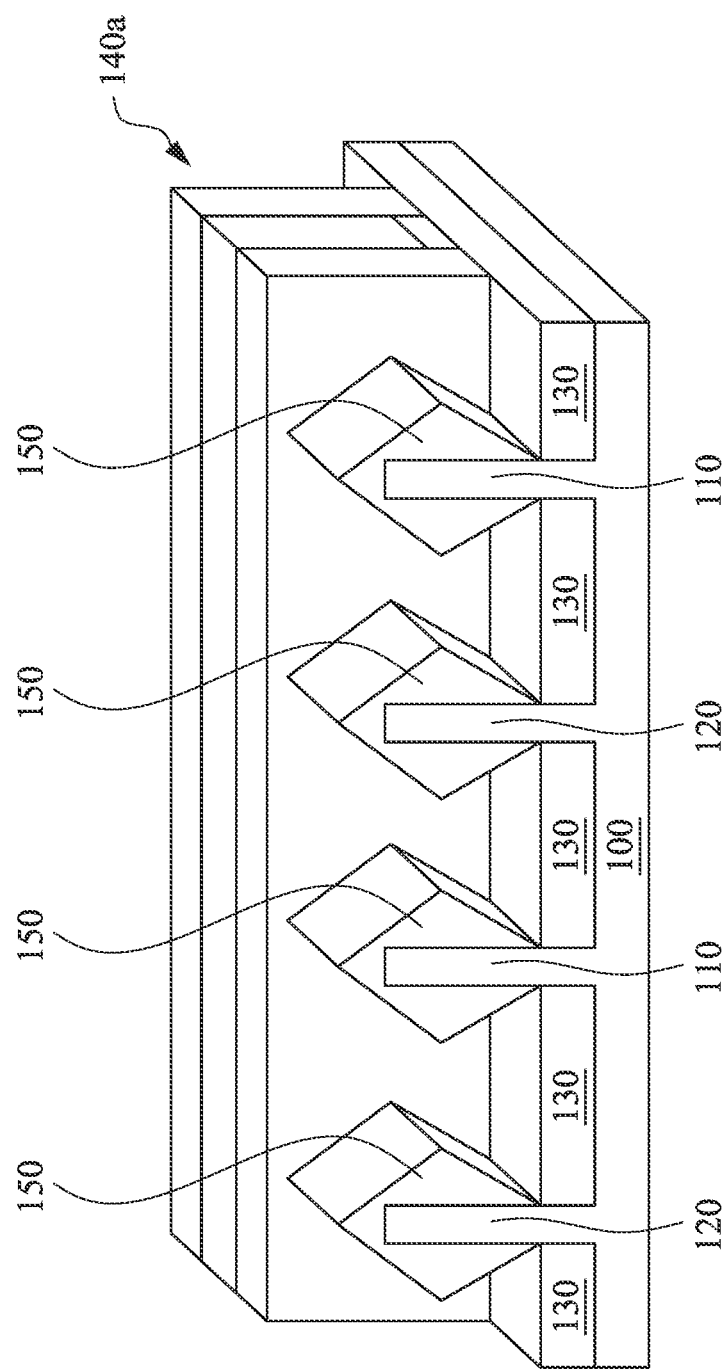

As shown in FIG. 1C and FIG. 1D, source/drain devices 150 are grown on the first source/drain region 110*b* and the second source/drain region 120*b*. In some embodiments, the source/drain devices 150 are grown by an epi operation. In some embodiments, the source/drain devices 150 include epitaxially grown silicon (epi Si), silicon carbide or silicon germanium. In some embodiments, the source/drain devices 150 are in-situ doped or undoped during the epi operation. In some embodiments, when the source/drain devices 150 are undoped during the epi operation, the source/drain devices 150 are doped during a subsequent operation. The subsequent doping operation is achieved by an ion implantation, plasma immersion ion implantation, other suitable operations, and/or a combination thereof. In some embodiments, the source/drain devices 150 are further exposed to annealing operations after forming the source/drain devices 150 and/or after the subsequent doping operation.

Figure 1E:
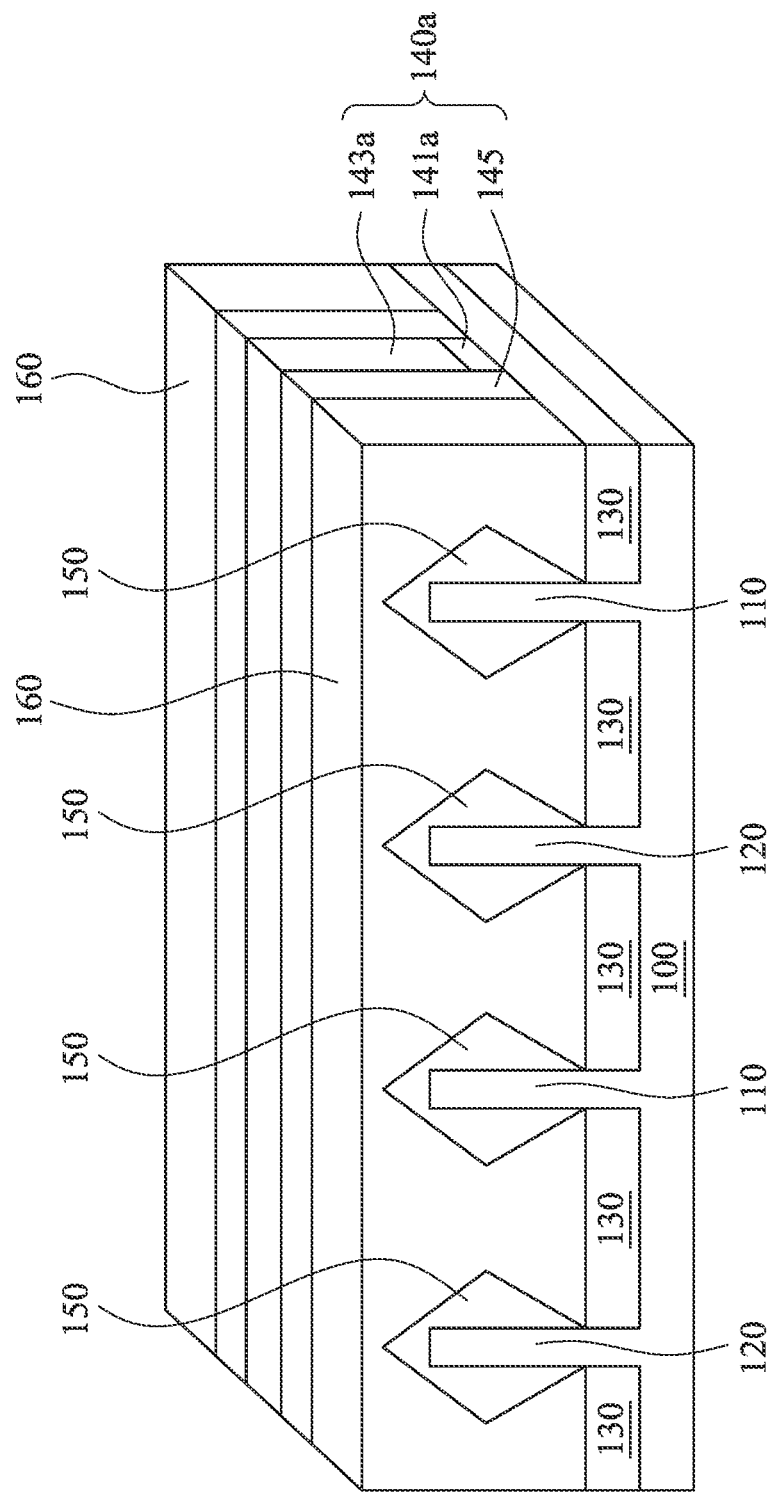

As shown in FIG. 1E, an inter-layer dielectric (ILD) layer 160 is deposited between and over the adjacent source/drain devices. In some embodiments, the ILD layer 160 is deposited by CVD, PVD, ALD, high density plasma (HDP) operation, spin-on-dielectric operation, other suitable operations, and/or a combination thereof. In some embodiments, the ILD layer 160 is formed from a low-k material. In some embodiments, the ILD layer 160 includes a silane-based insulating material. In some embodiments, the ILD layer 160 includes silicon oxide, silicon nitride, undoped silicate glass (USG), Boro-Silicate Glass (BSG), TEOS, other suitable low-k silane-based materials, and/or a combination thereof. The operation of depositing the ILD layer 160 is followed by a planarization operation, in some embodiments. In at least one embodiment, the planarization operation includes a chemical mechanical polishing (CMP) operation, other suitable planarization operations, and/or a combination thereof.

Figure 1F:
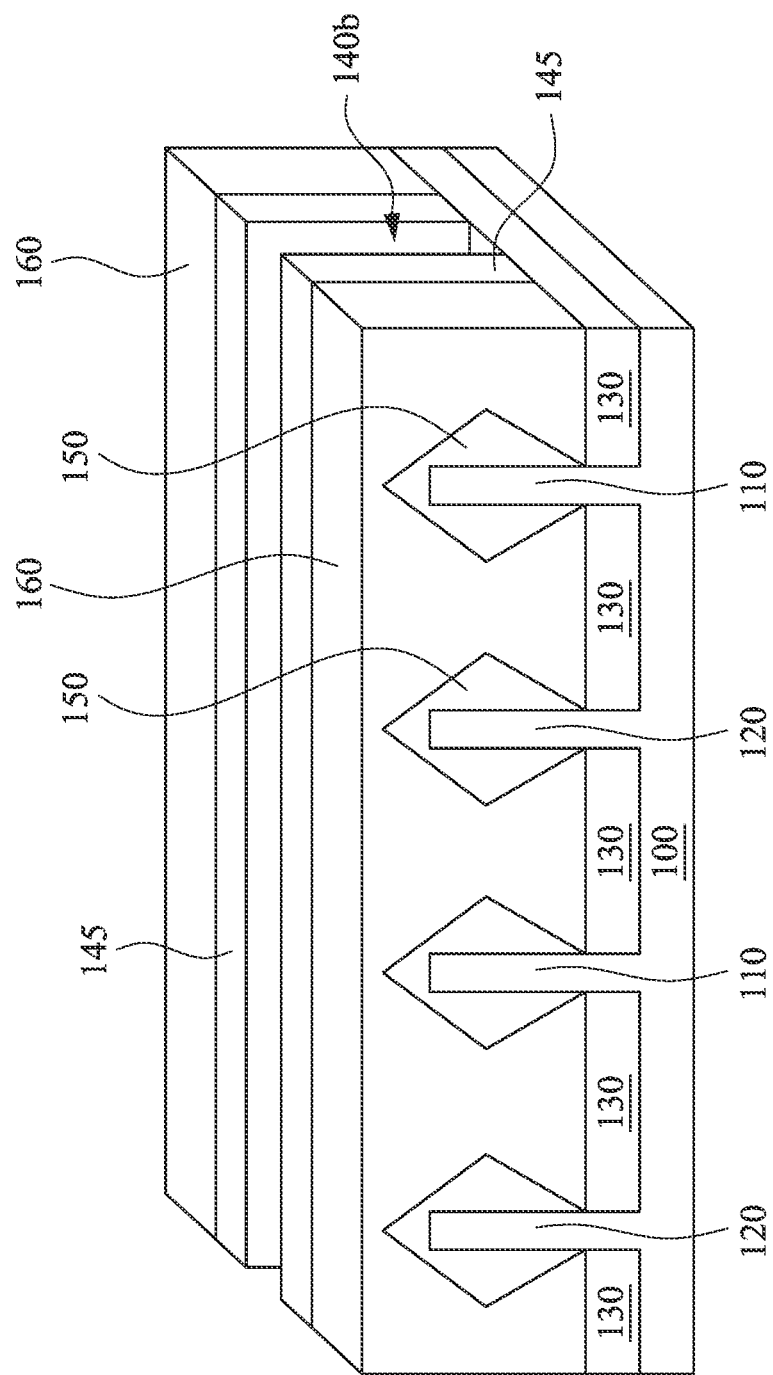
Figure 1G:
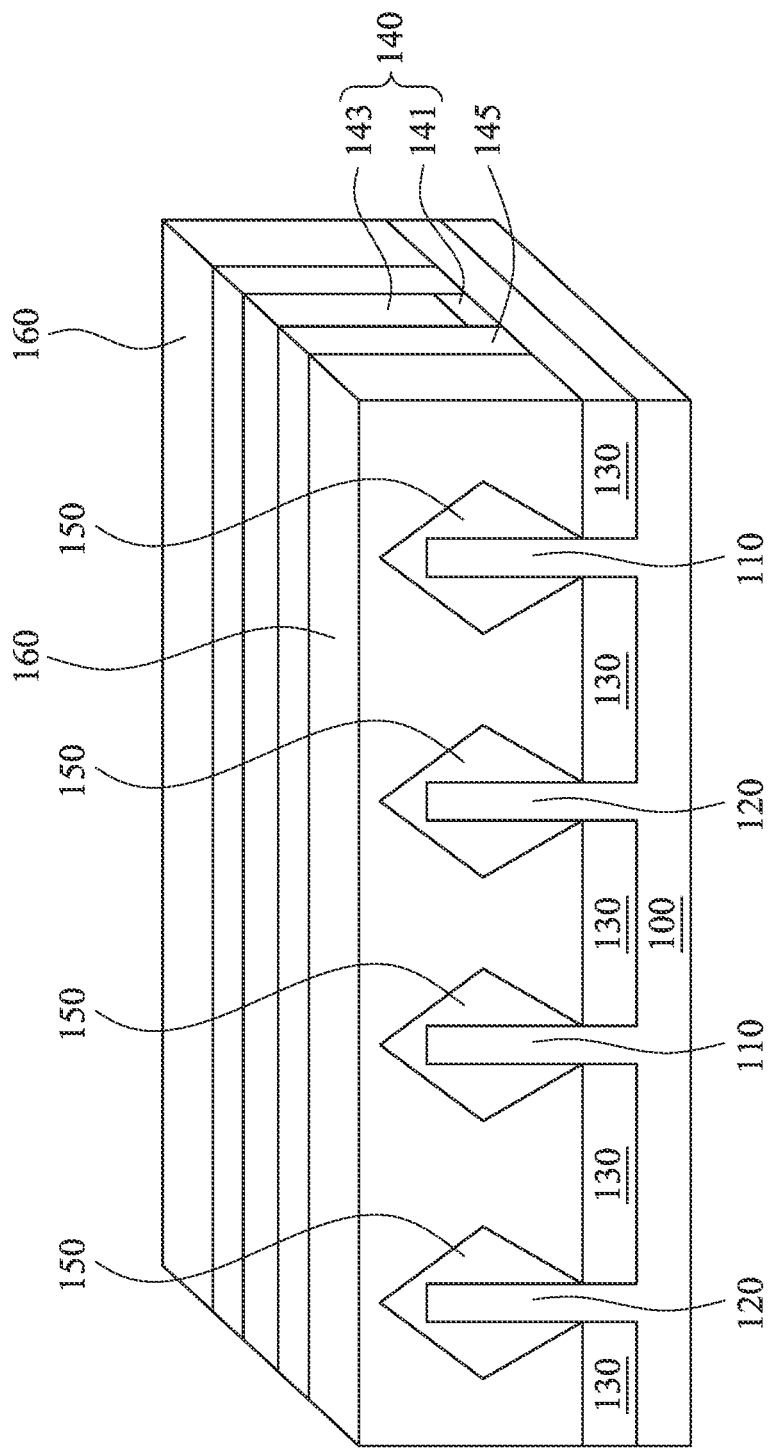

As shown in FIG. 1F and FIG. 1G, the gate insulating layer 141*a* and the poly silicon layer 143*a* are removed by dry etching operation and/or wet etching operation, thereby forming a gate-line opening 140*b*. The metal gate structure 140 is formed in the gate-line opening 140*b*. The metal gate structure 140 wraps the channel region of the semiconductor device. The metal gate structure 140 includes a dielectric layer 141 and a metal gate layer 143 formed on the dielectric layer 141.

Figure 1H:
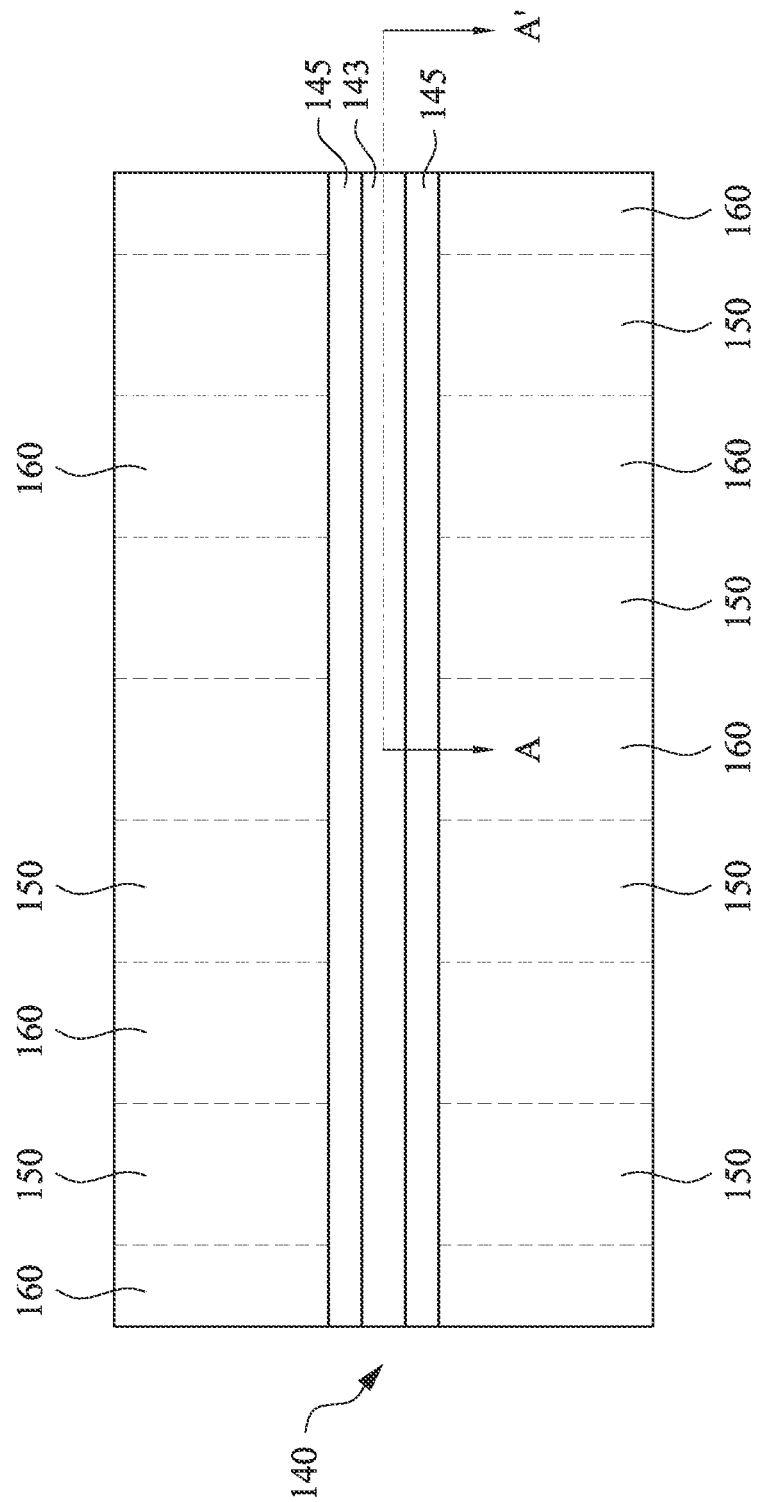
FIG. 1H is a schematic top view of the semiconductor device in FIG. 1G in accordance with some embodiments of the present disclosure.
Figure 1I:
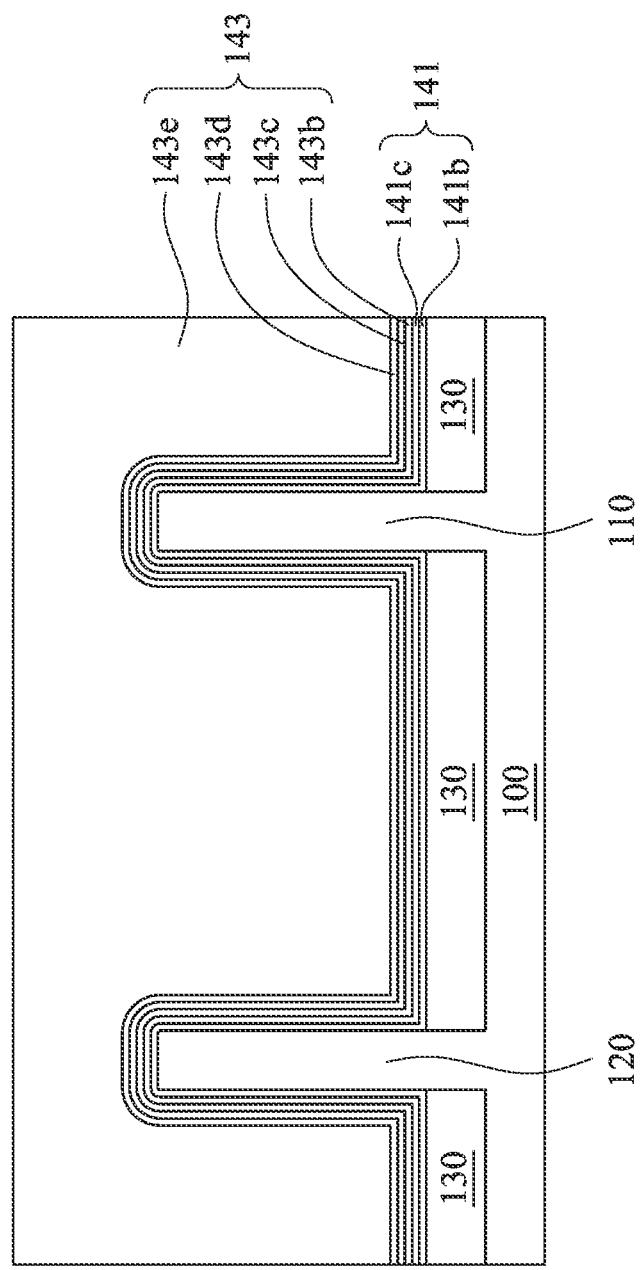
FIG. 1I is a schematic cross-sectional view of the semiconductor device along a line A-A' in FIG. 1H in accordance with some embodiments of the present disclosure.

Referring to FIG. 1G together with FIG. 1H and FIG. 1I, FIG. 1H is a schematic top view of the semiconductor device in FIG. 1G in accordance with some embodiments of the present disclosure, and FIG. 1I is a schematic cross-sectional view of the semiconductor device along a line A-A' in FIG. 1H in accordance with some embodiments of the present disclosure. Although top portions of the channel region of the fins 110 and 120 are illustrated as having a rectangular shape (right angle) for an illustration purpose in FIG. 1I, the top portions of the channel region of the fins 110 and 120 generally has a round shape. The dielectric layer 141 includes an interfacial layer 141*b* and a gate dielectric layer 141*c* formed on the interfacial layer 141*b*. In some embodiments, the interfacial layer 141*b* is formed by chemical oxidation, thermal oxidation, ALD, CVD, other suitable operations, and/or a combination thereof. In some embodiments, the interfacial layer 141*b* includes a dielectric material. In some embodiments, the interfacial layer 141*b* includes silicon dioxide, silicon oxynitride, other suitable dielectric materials, and/or a combination thereof. In some embodiments, the gate dielectric layer 141*c* is formed by ALD, PVD, oxidation, other suitable operations, and/or a combination thereof. In some embodiments, the gate dielectric layer 141*c* includes a high-k dielectric material. In some embodiments, the gate dielectric layer 141*c* includes silicon dioxide, hafnium oxide ($HfO_2$), $TiO_2$, HfZrO, $Ta_2O_3$, $HfSiO_4$, $ZrO_2$, $ZrSiO_2$, other suitable high-k dielectric materials, and/or a combination thereof.

The metal gate layer 143 includes underlying layers such as a barrier layer 143*b*, a work function adjustment layer 143*c*, an adhesion layer 143*d* and a main metal layer 143*e*. The barrier layer 143*b* is made of TiN, TaN, TiAlN, TaCN, TaC, TaSiN, other suitable materials, and/or a combination thereof. The work function adjustment layer 143*c* is formed over the barrier layer 143*b*. In some embodiments, the work function adjustment layer 143*c* is formed by ALD, PVD, CVD, e-beam evaporation, other suitable processes, and/or a combination thereof. The work function layer 143*c* is made of a conductive material. In some embodiments, the work function layer 143*c* is made of a single layer or a multilayer. In some embodiments, the work function layer 143*c* is made of TiN, TaN, TaAlC, TiC, TaC, Co, Al, TiAl, HfTi, TiSi, TaSi, TiAlC, other suitable materials, and/or a combination thereof. For example, one or more of TaN, TaAlC, TiN, TiC, Co, TiAl, HfTi, TiSi and TaSi is used as the work function adjustment layer 143*c* for the n-channel FET, and one or more of TiAlC, Al, TiAl, TaN, TaAlC, TiN, TiC and Co is used as the work function adjustment layer 143*c* for the p-channel FET. In some embodiments, the work function adjustment layer 143*c* may be formed separately for the n-channel FinFET and the p-channel FinFET which may use different metal layers. The adhesion layer 143*d* is formed over the work function layer 143*c*. The adhesion layer 143*d* is made of TiN, TaN, TiAlN, TaCN, TaC, TaSiN, other suitable materials, and/or a combination thereof. The main metal layer 143*e* is formed over the adhesion layer 143*d*. In some embodiments, the metal gate layer 143 is formed by CVD, PVD, ALD, electroplating, other suitable operations, and/or a combination thereof. The main metal layer 143*e* includes one or more layers of any suitable metal material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or a combination thereof. In some embodiments, a planarization operation is performed after the metal gate structure 140 is formed.

Figure 1J:
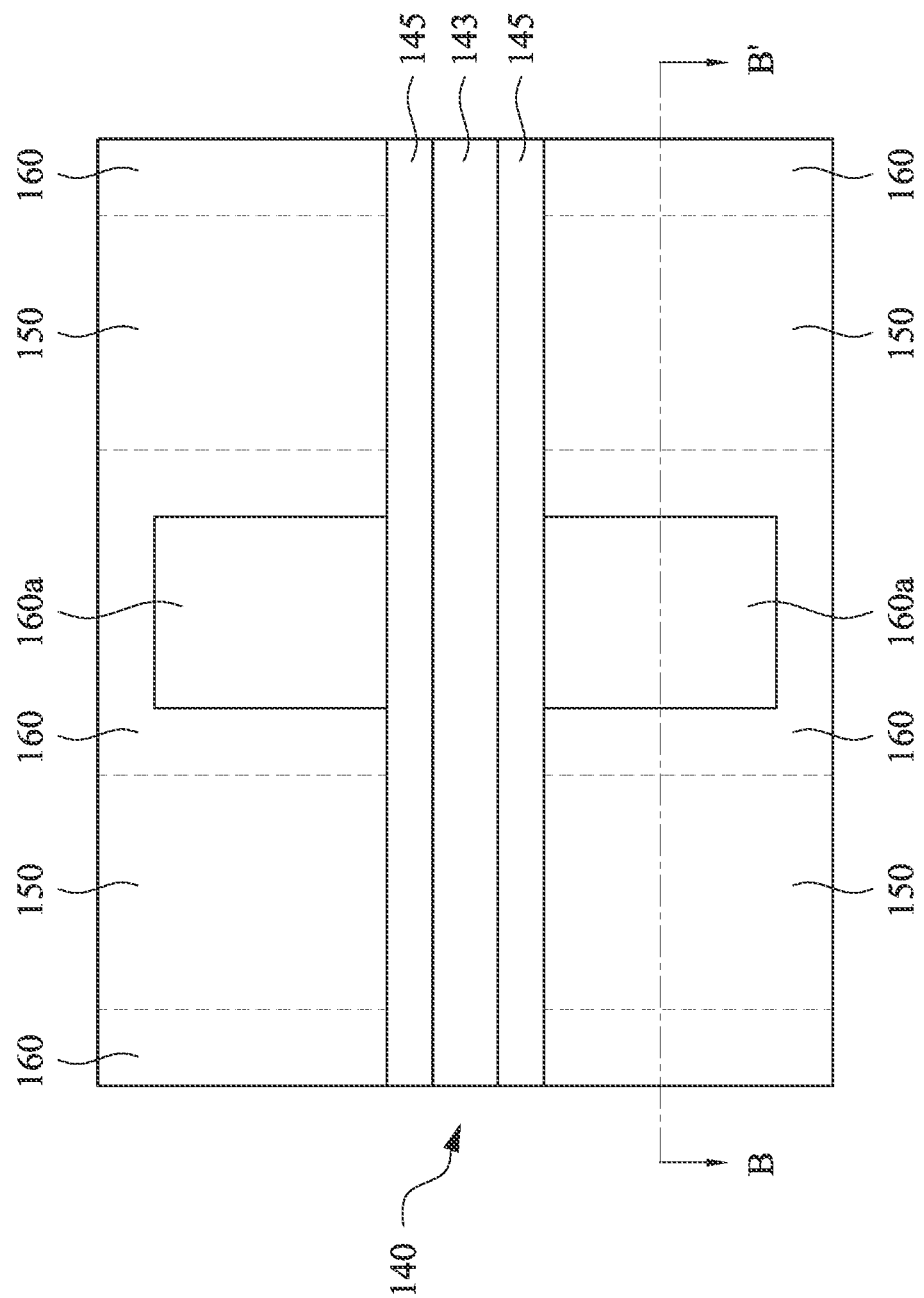
FIG. 1J is a schematic top view of a portion of the semiconductor device during a replacement operation in accordance with some embodiments of the present disclosure.
Figure 1K:
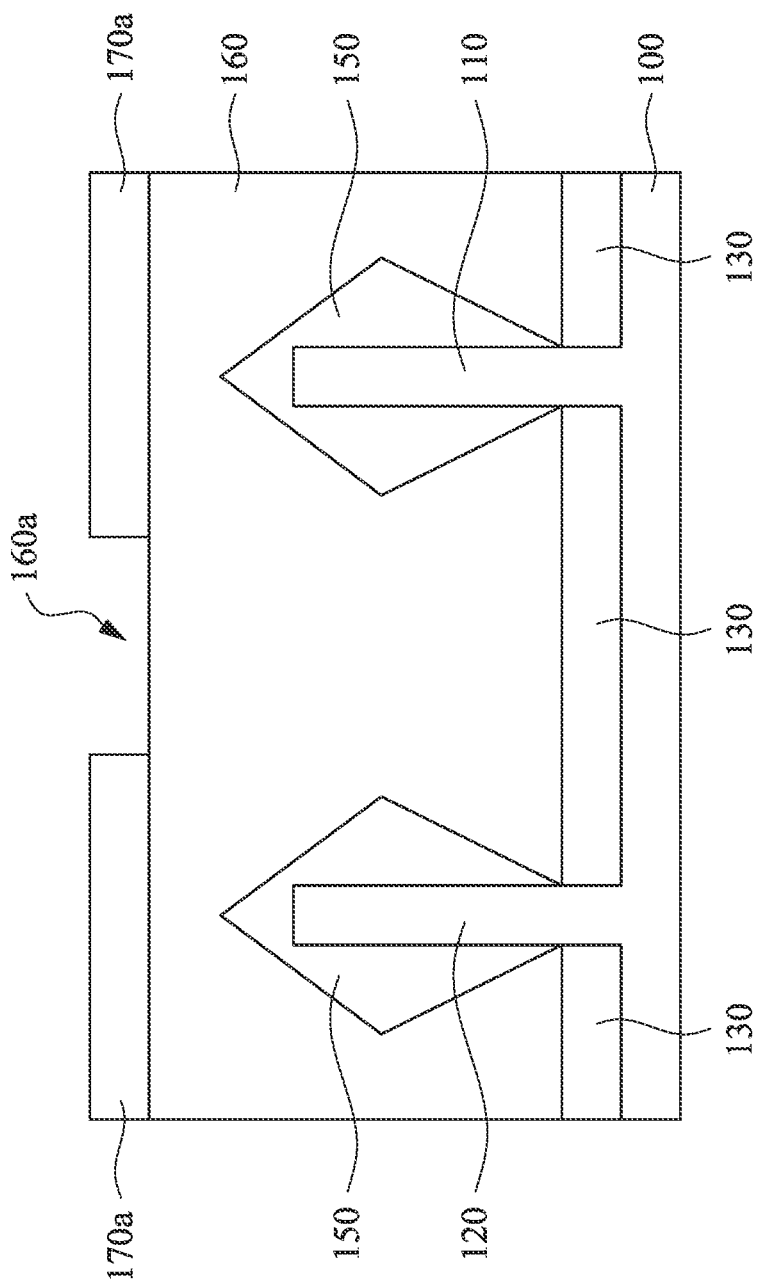
FIG. 1K to FIG. 1M are schematic cross-sectional views of the semiconductor device along a line B-B' in FIG. 1J during a replacement operation in accordance with some embodiments of the present disclosure.
Figure 1L:
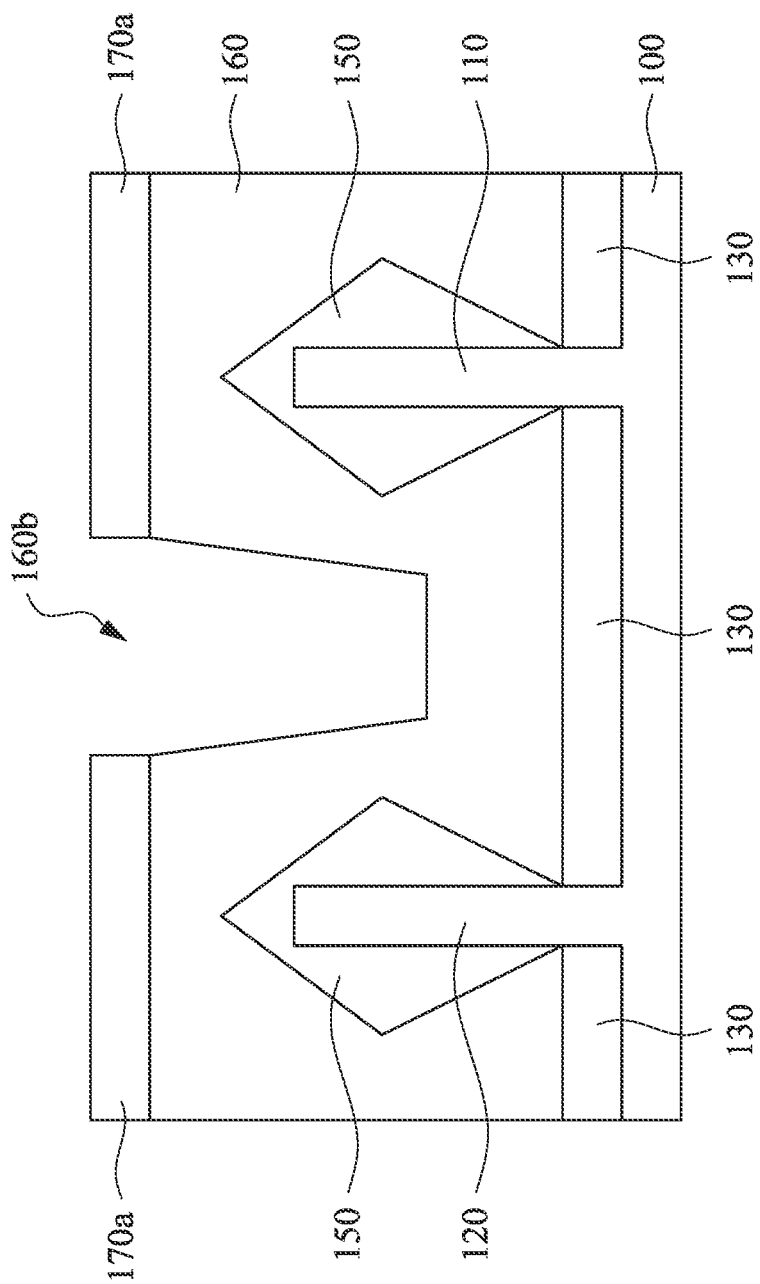
Figure 1M:
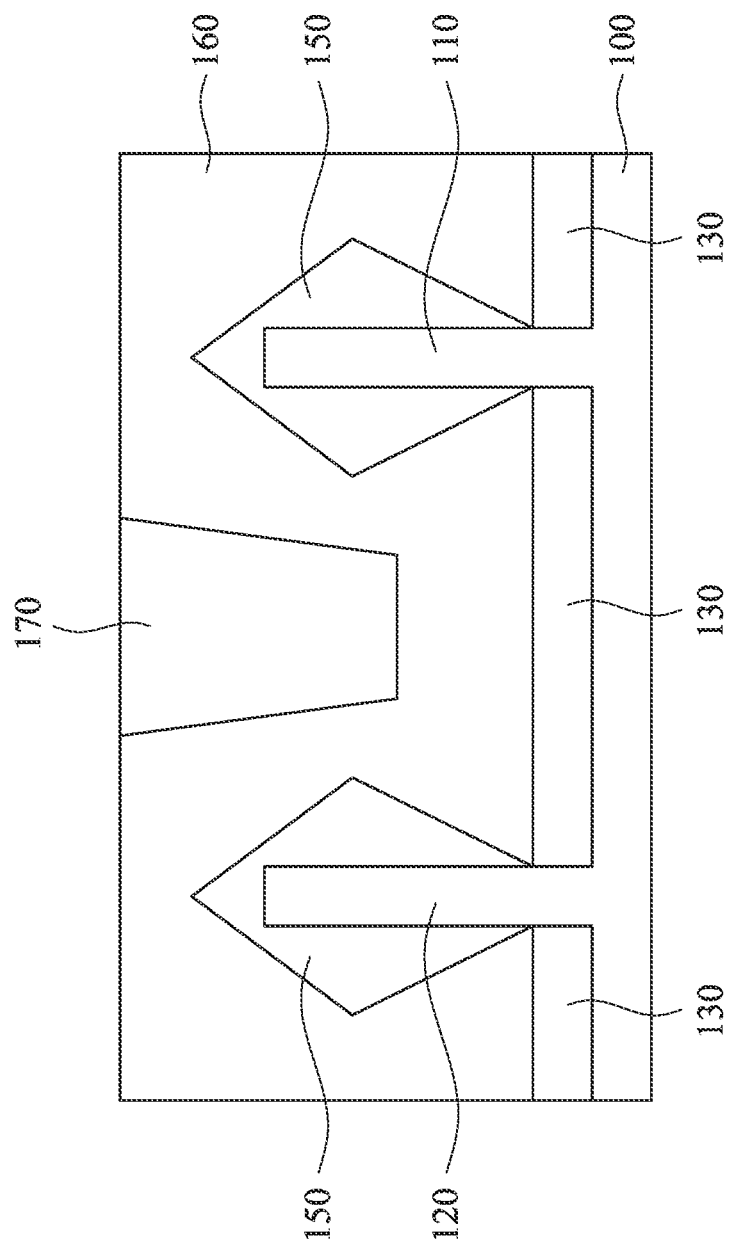

Referring to FIG. 1J to FIG. 1M, FIG. 1J is a schematic top view of a portion of the semiconductor device during a replacement operation in accordance with some embodiments of the present disclosure, and FIG. 1K to FIG. 1M are schematic cross-sectional views of the semiconductor device along a line B-B' in FIG. 1J during a replacement operation in accordance with some embodiments of the present disclosure. The replacement operation is performed to replace a portion 160*a* of the ILD layer 160 with an isolation material, thereby forming an isolation portion 170 between the adjacent source/drain devices 150. In some embodiments, the portion 160*a* of the ILD layer 160 is adjacent to the metal gate structure 140. In some embodiments, the replacement operation is performed by an etching operation and followed by a deposition operation. The etching operation includes a dry etching, a wet etching, other suitable etching operations, and/or a combination thereof. In this embodiment, a resist layer is first formed on the metal gate structure 140 and the ILD layer 160, and then the resist layer is patterned by a lithography operation, thereby forming a hard mask 170*a* over the metal gate structure 140 and the ILD layer 160, further exposing the portion 160a of the ILD layer 160. Next, the portion 160a of the ILD layer 160 is etched by an etchant, thereby forming an opening 160b in the ILD layer 160. Thereafter, the isolation material is deposited to fill the opening 160b, thereby forming the isolation portion 170. In some embodiments, the semiconductor device is further subjected to a planarization operation to remove the isolation material deposited over the metal gate structure 140. In other words, the isolation portion 170, the ILD layer 160 and the metal gate structure 140 are substantially coplanar after the planarization operation. In some embodiments, the source/drain devices 150 are not damaged by the etchant during the etching operation. In some embodiments, the source/drain devices 150 are not exposed by the opening 160b. In some embodiments, the isolation material includes yttrium silicate ($YSiO_x$), SiN, LaO, W, ZrO, HfO, SiCN, SiC, SiOC, Si, SiB, BN, AlO, WC, Co, AlN, other suitable isolation materials, and/or a combination thereof.

Figure 1N:
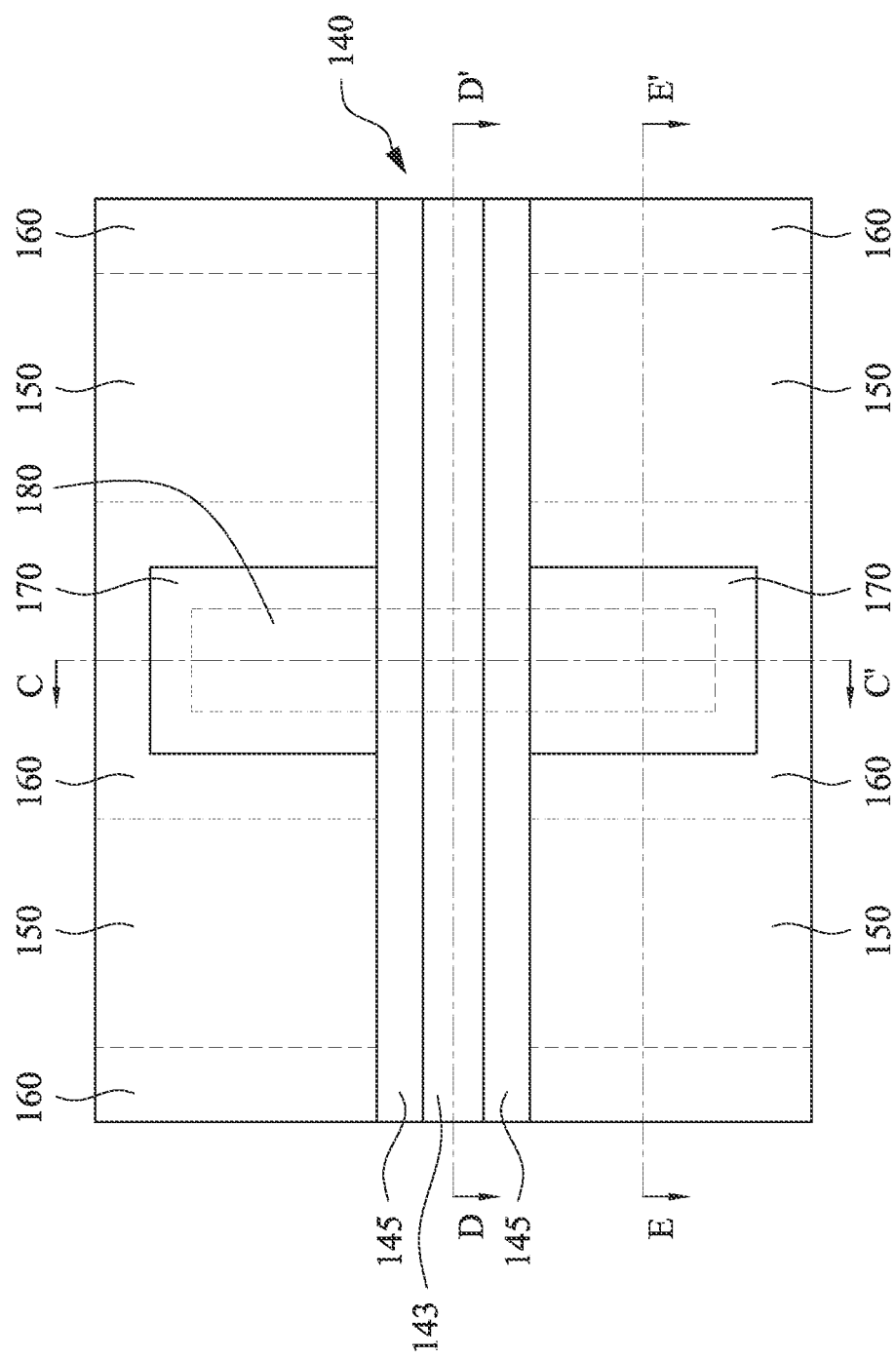
FIG. 1N is a schematic top view of the semiconductor device during a metal gate cut operation in accordance with some embodiments of the present disclosure.
Figure 10:
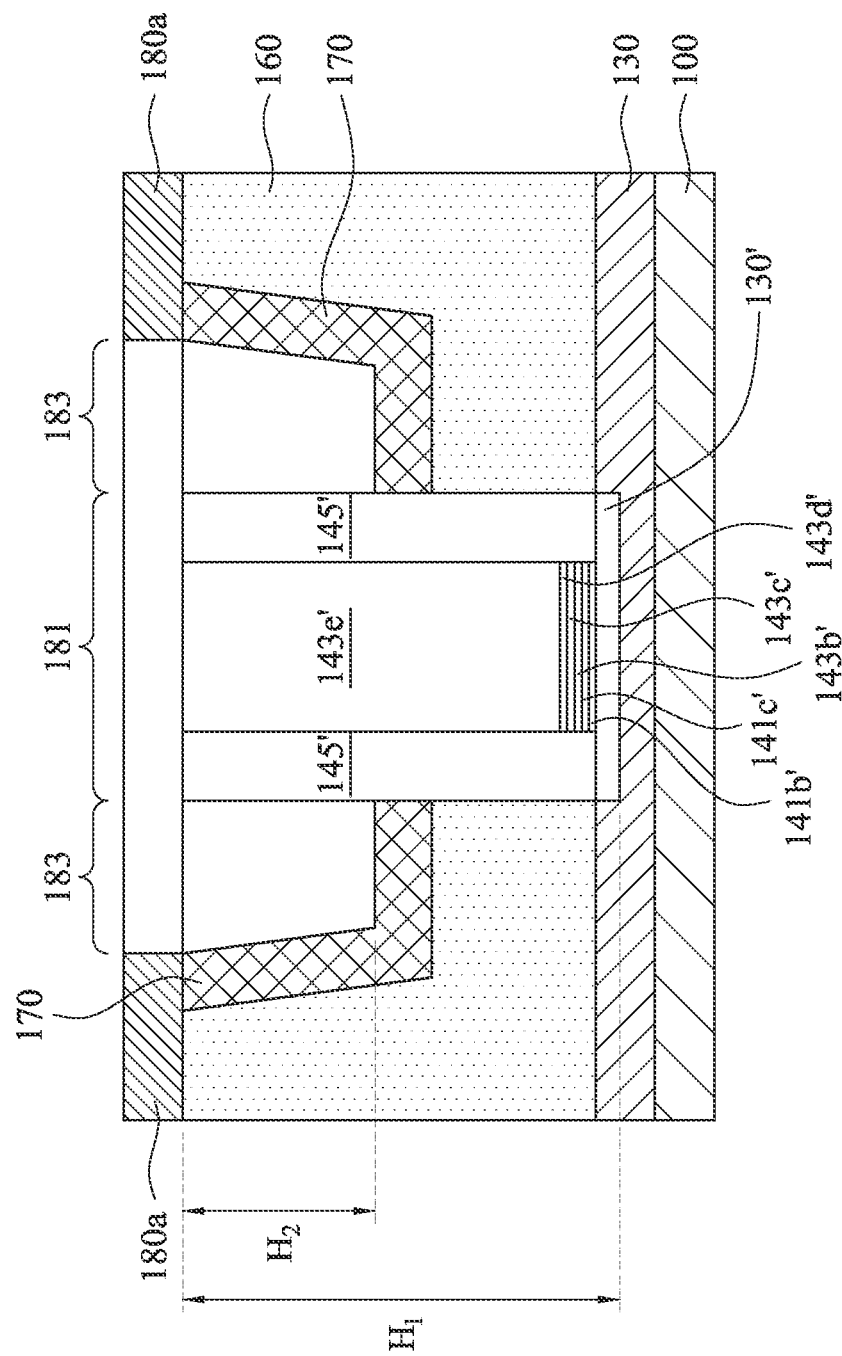
Figure 10A:
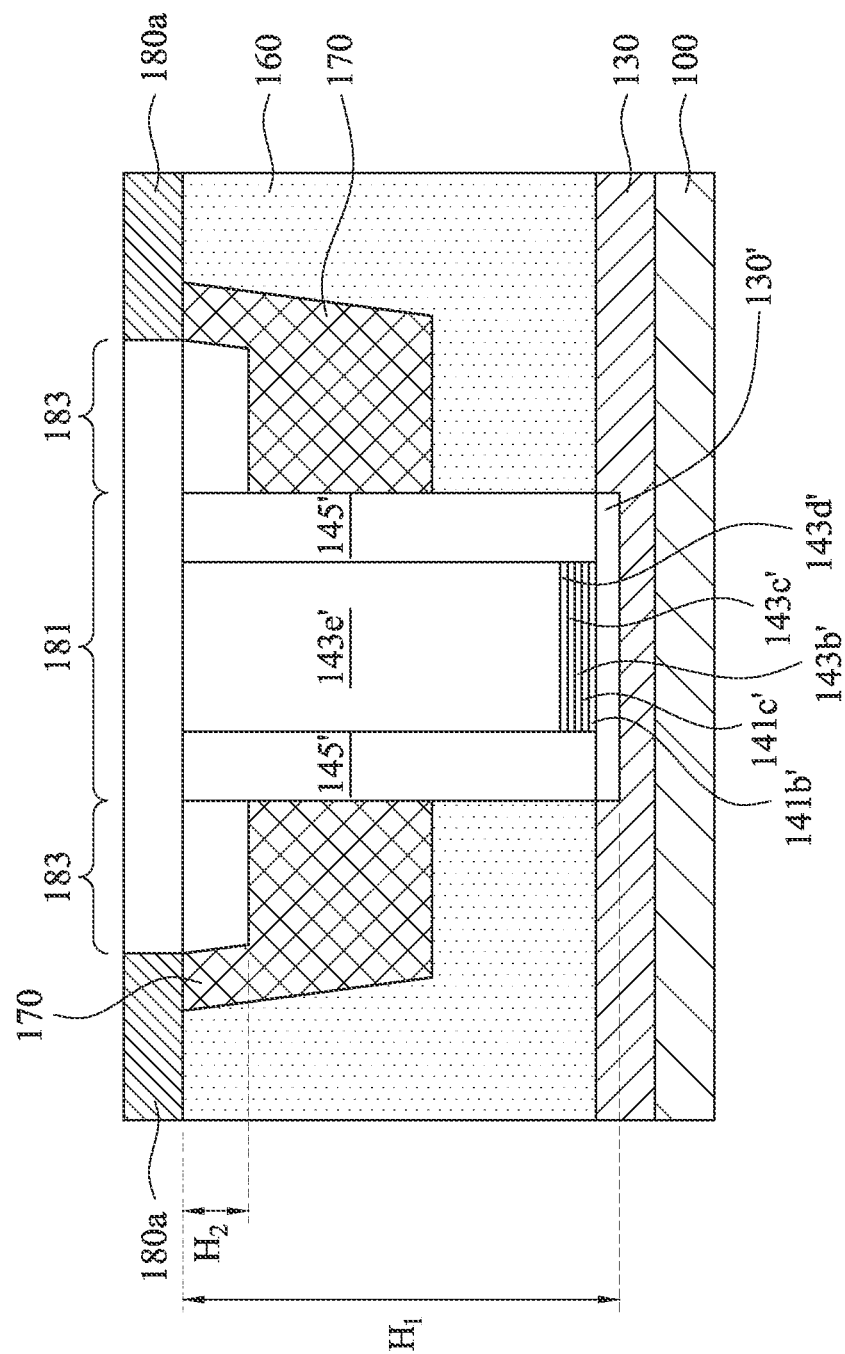
Figure 1P:
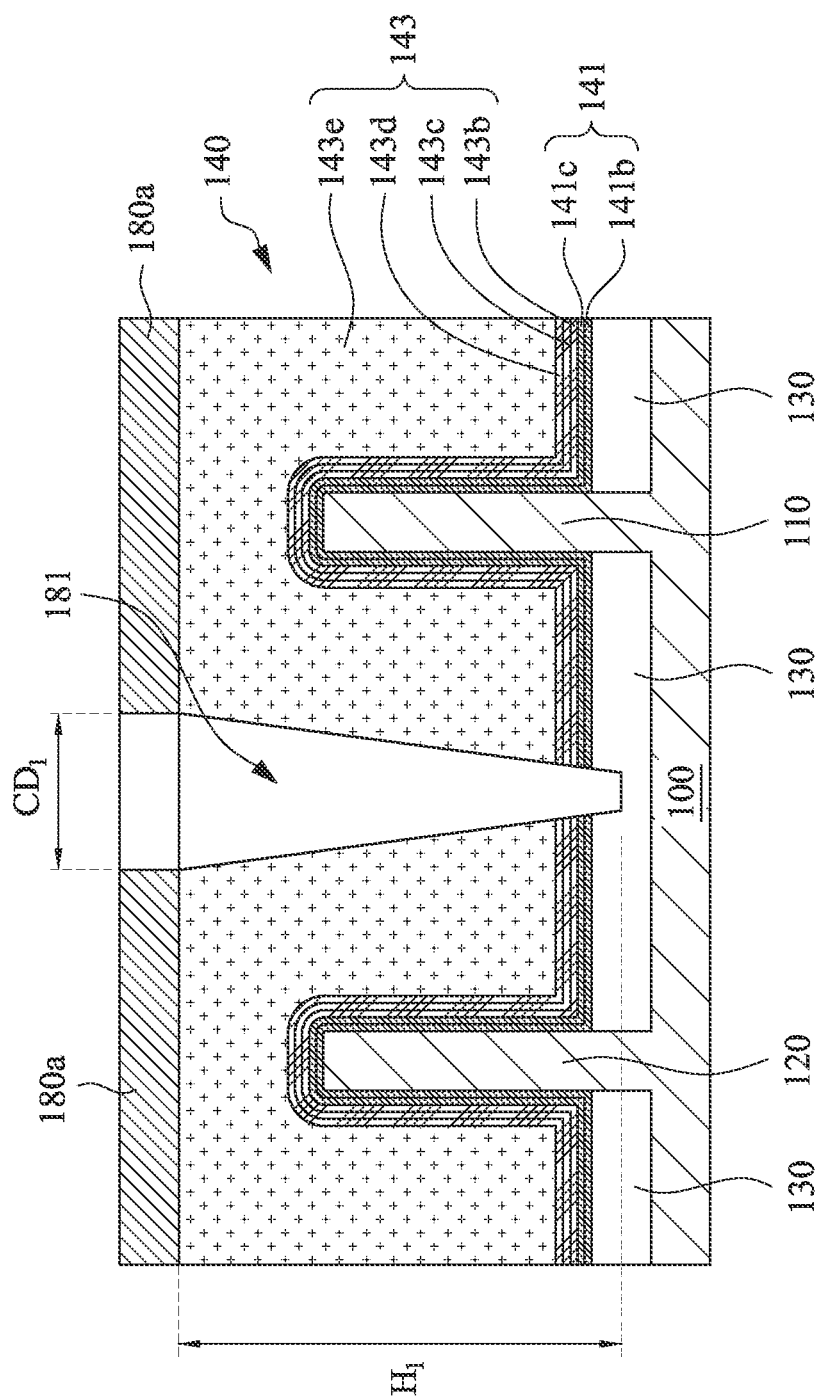
FIG. 1P is a schematic cross-sectional view of the semiconductor device along a line D-D' in FIG. 1N in accordance with some embodiments of the present disclosure.
Figure 1Q:
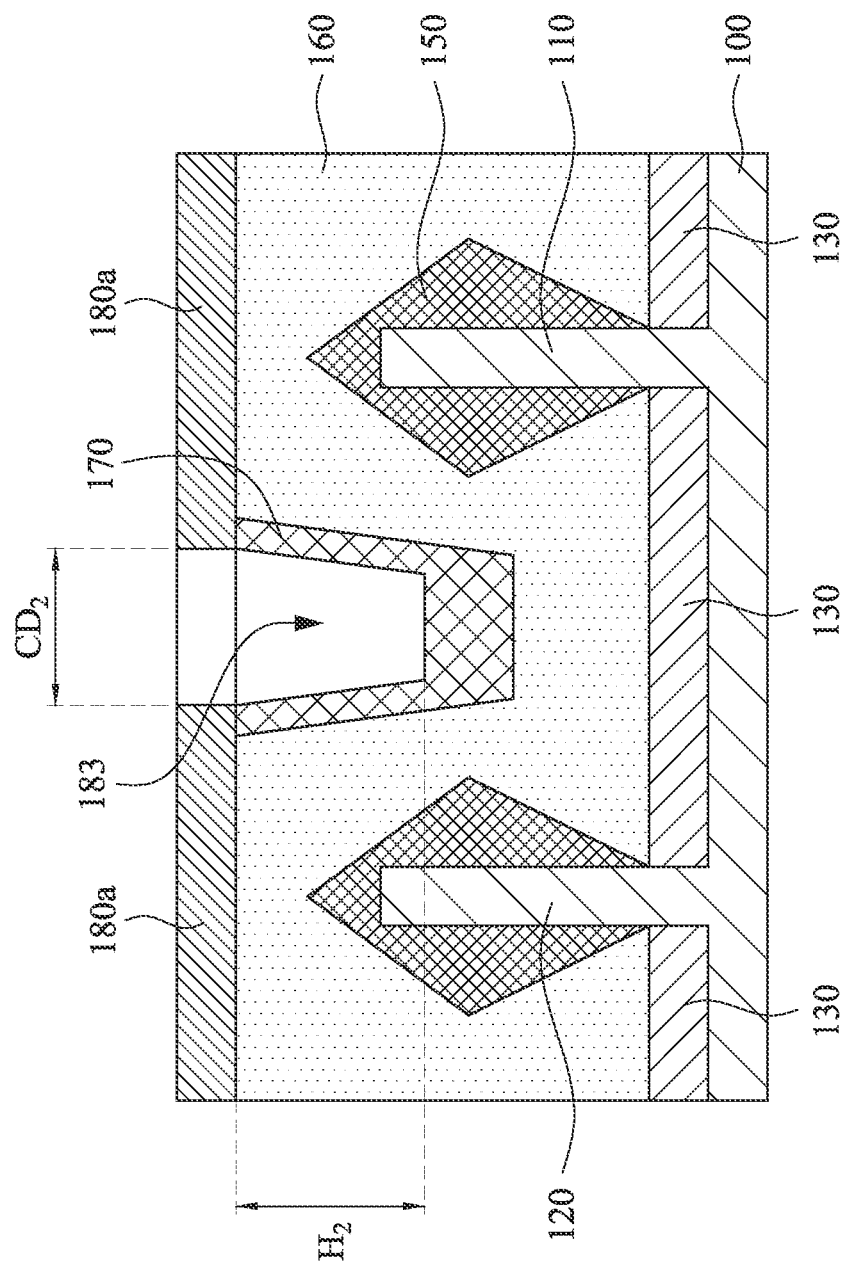
FIG. 1Q is a schematic cross-sectional view of the semiconductor device along a line E-E' in FIG. 1N in accordance with some embodiments of the present disclosure.
Figure 1Q:
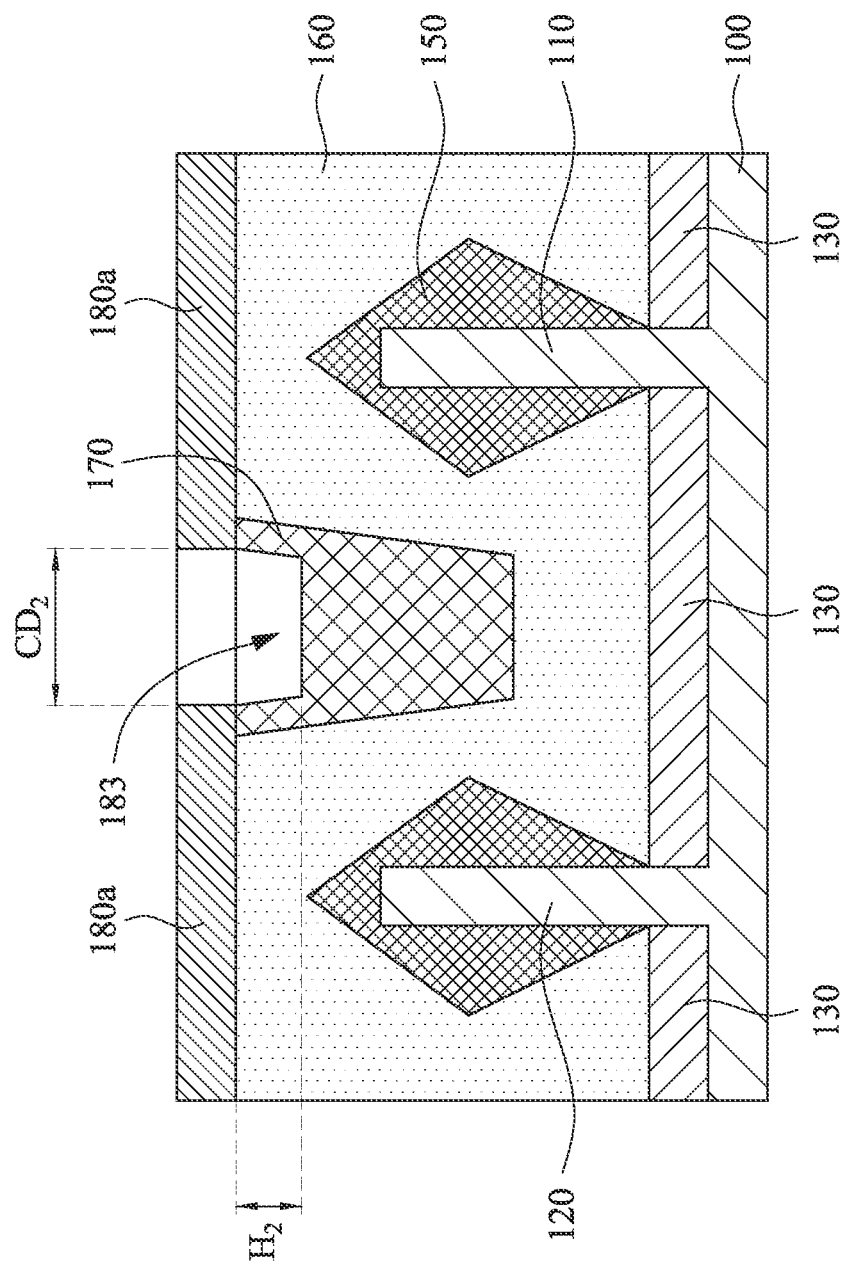

Referring to FIG. 1N to FIG. 1Q, FIG. 1N is a schematic top view of the semiconductor device during a metal gate cut operation in accordance with some embodiments of the present disclosure, FIG. 1O is a schematic cross-sectional view of the semiconductor device along a line C-C' in FIG. 1N in accordance with some embodiments of the present disclosure, FIG. 1P is a schematic cross-sectional view of the semiconductor device along a line D-D' in FIG. 1N in accordance with some embodiments of the present disclosure, and FIG. 1Q is a schematic cross-sectional view of the semiconductor device along a line E-E' in FIG. 1N in accordance with some embodiments of the present disclosure. After the isolation portion 170 is formed in the ILD layer 160, a metal gate cut operation is performed on a cut region extending through the metal gate structure 140 to the isolation portion 170, thereby forming a first opening 181 in the metal gate structure 140 and a second opening 183 in the isolation portion 170. A cut region 180 of the metal gate cut operation is located between the first fin 110 and the second fin 120. In some embodiments, the cut region 180 of the metal gate cut operation is located between the adjacent source/drain devices 150. In some embodiments, the cut region 180 substantially covers the isolation portion 170. In some embodiments, the metal gate cut operation includes an etching operation. The etching operation includes a dry etching, other suitable etching operations, and/or a combination thereof. In FIG. 1P and FIG. 1Q, it should be realized that surfaces and/or elements behind the first opening 181 or the opening 183 are omitted for clear understanding.

As shown in FIG. 1N to FIG. 1P, a patterned hard mask 180a covers the metal gate structure 140, but a portion of the metal gate structure 140 is exposed by the patterned hard mask 180a. In some embodiments, the exposed portion of the metal gate structure 140 conforms to the cut region 180. During the metal gate cut operation, the metal gate layer 143, the dielectric layer 141, the sidewall spacers 145 and the trench isolation 130 underlying the exposed portion are bombarded by an etchant of the metal gate cut operation, such as respective bombarded elements 130', 141b', 141c', 143b', 143c', 143d', 143e' and 145' shown in FIG. 1O, thereby forming the first opening 181. In some embodiments, the trench isolation 130 is exposed by the first opening 181. In some embodiments, a distance of the first depth H1 is substantially greater than heights of the first fin 110 and the second fin 120. For example, a first depth H1 of the first opening 181 is in a range substantially from 120 nm to 220 nm.

As shown in FIG. 1N, FIG. 1O and FIG. 1Q, the patterned hard mask 180a covers the ILD layer 160 and a portion of the isolation portion 170, such that other portion of the isolation portion 170 is exposed by the patterned hard mask 180a. In some embodiments, the ILD layer 160 is not exposed by the patterned hard mask 180a. In other words, the isolation portion 170 substantially conforms to the cut region 180. The isolation portion 170 is etched by the etchant during the metal gate cut operation, thereby forming the second opening 183. In some embodiments, the second opening 183 is located in the isolation portion 170. In some embodiments, the source/drain devices 150 are not exposed by the second opening 183. In some embodiment, the source/drain devices 150 are not damaged by the etchant during the metal gate cut operation. In some embodiments, a bottom of the second opening 183 is elevated higher than the source/drain devices 150, as shown in FIG. 1O(A) and FIG. 1Q(A). For example, a second depth H2 of the second opening 183 is in a range substantially from 50 nm to 150 nm.

As shown in FIG. 1O to FIG. 1Q, the etchant of the metal gate cut operation has a lower etching selectivity with respect to the isolation portion 170 than to the metal gate structure 140, such that the first depth $H_1$ of the first opening 181 is greater than the second depth $H_2$ of the second opening 183. In some embodiments, a ratio of the first depth $H_1$ and the second depth $H_2$ is substantially greater than 1 and smaller than or equal to 10. In some embodiments, the ratio of the first depth $H_1$ and the second depth $H_2$ is substantially greater than 1 and smaller than or equal to 8.5. In some embodiments, the ratio of the first depth $H_1$ and the second depth $H_2$ is substantially greater than 1 and smaller than or equal to 7. In some embodiments, the source/drain devices 150 are easily damaged by the etchant of the metal gate cut operation when the ratio of the first depth $H_1$ and the second depth $H_2$ is equal to or less than 1. If the ratio of the first depth $H_1$ and the second depth $H_2$ is larger than 10, the metal gate cut operation cannot truly cut the isolation portion 170, such that a semiconductor wafer including the structure cannot be cut, thereby being dissatisfy with critical dimension requirements. In this embodiment, a first critical dimension $CD_1$ (i.e. a critical dimension near a top portion of the first opening 181 and along a direction perpendicular to the line C-C' in FIG. 1N) of the first opening 181 is greater than a second critical dimension $CD_2$ (i.e. a critical dimension near a top portion of the second opening 183 and along a direction perpendicular to the line C-C' in FIG. 1N) of the second opening 183. For example, the first critical dimension $CD_1$ of the first opening 181 is in a range substantially from 13 nm to 30 nm, and the second critical dimension $CD_2$ of the second opening 183 is in a range substantially from 8 nm to 26 nm. In some embodiments, a difference value between the first critical dimension $CD_1$ and the second critical dimension $CD_2$ is in a range substantially from 1 nm to 15 nm. In some embodiments, the difference value is in a range substantially from 1 nm to 10 nm. In some embodiments, the difference value is in a range substantially from 3 nm to 10 nm. If the difference value between the first critical dimension $CD_1$ and the second critical dimension $CD_2$ is not fallen into the aforementioned range, the ratio of the first depth $H_1$ and the second depth $H_2$ will be not satisfied with the aforementioned requirements (i.e. the aforementioned ranges), thereby failing to achieve the efficacy of the metal gate cut operation or inducing the damages of the source/drain devices. For example, the first critical dimension $CD_1$ of the first opening 181 substantially is 20 nm, and the second critical dimension $CD_2$ of the second opening 183 substantially is 16 nm.

During the metal gate cut operation, the etchant has a lower etching selectivity with respect to the isolation material of the isolation portion than to the conductive material of the metal gate layer and the materials of the dielectric layer, such that the first depth of the first opening is greater than the second depth of the second opening. Accordingly, the hard isolation portion blocks the etchant of the metal gate cut operation to excessively etch, thereby preventing the ILD layer from the bombarding, further preventing the source/drain devices from the damages induced by the etchant.

Figure 1R:
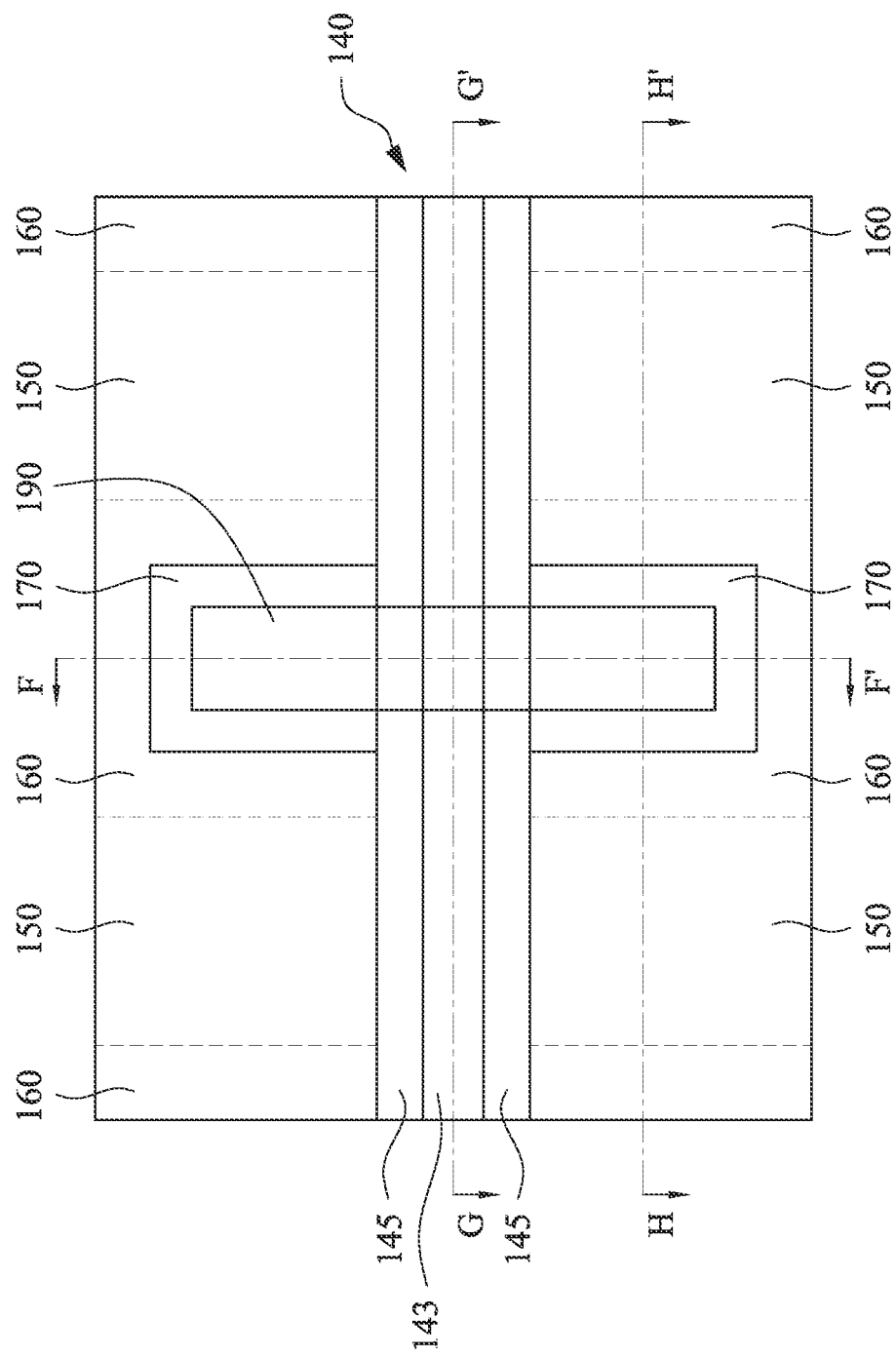
FIG. 1R is a schematic top view of the semiconductor device during a filling operation in accordance with some embodiments of the present disclosure.
Figure 1S:
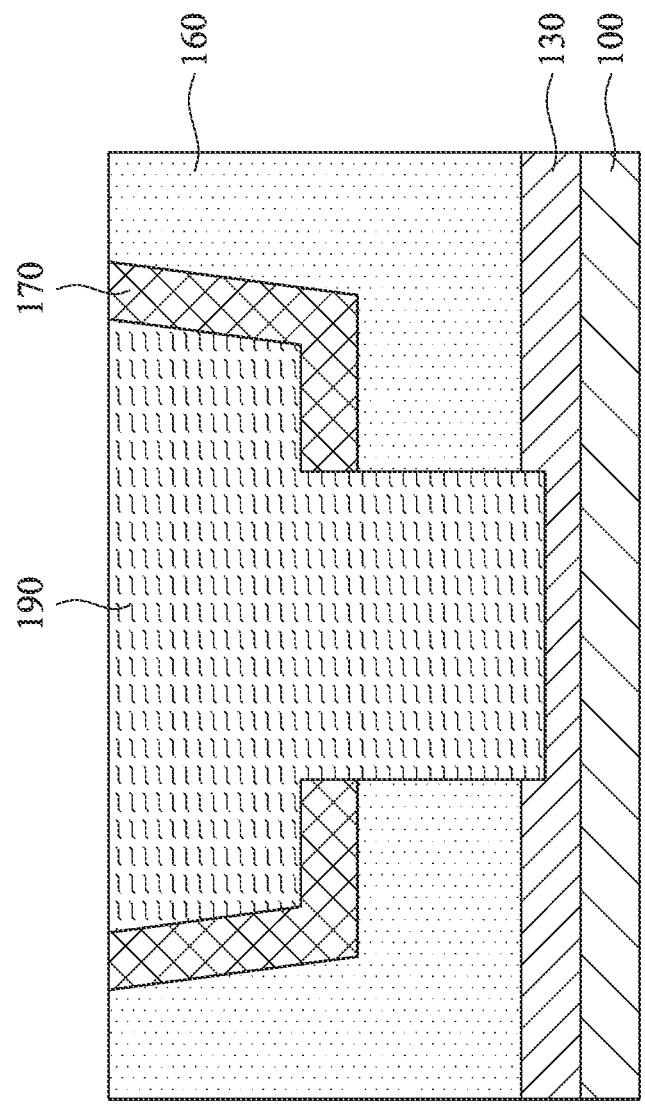
FIG. 1S is a schematic cross-sectional view of the semiconductor device along a line F-F' in FIG. 1R in accordance with some embodiments of the present disclosure.
Figure 1T:
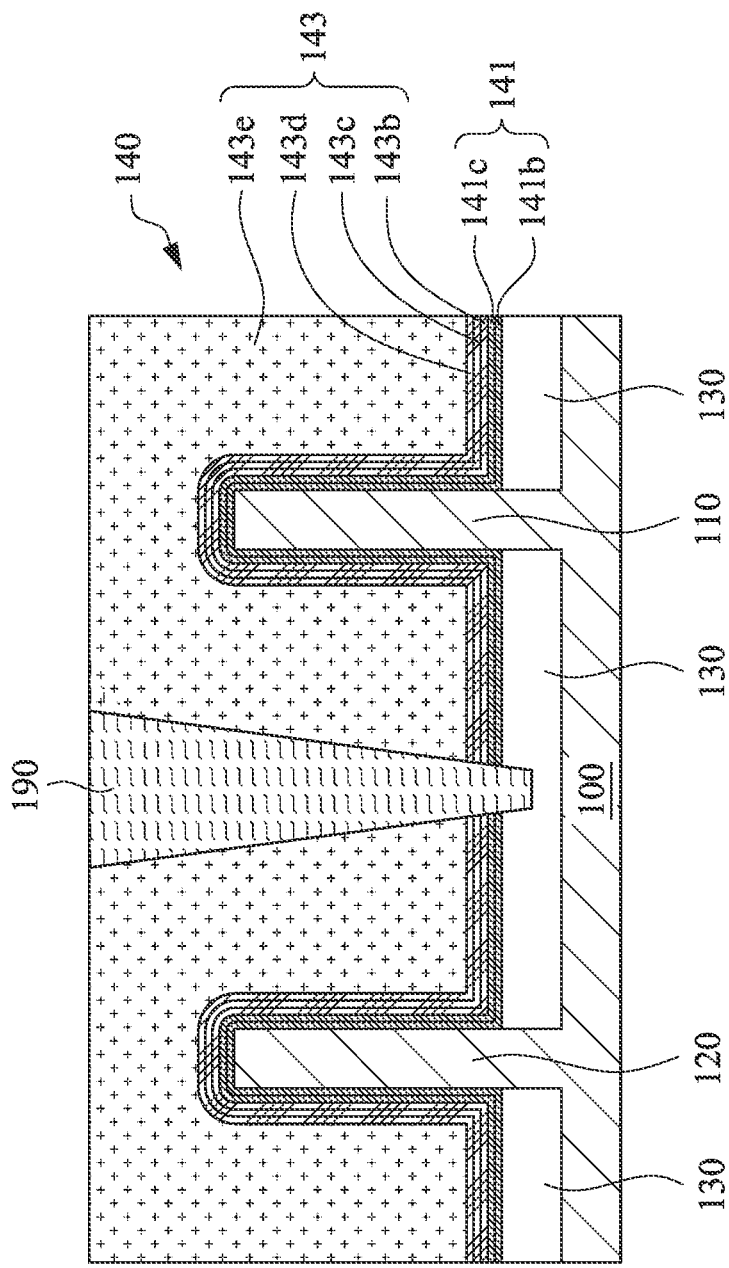
FIG. 1T is a schematic cross-sectional view of the semiconductor device along a line G-G' in FIG. 1R in accordance with some embodiments of the present disclosure.
Figure 1U:
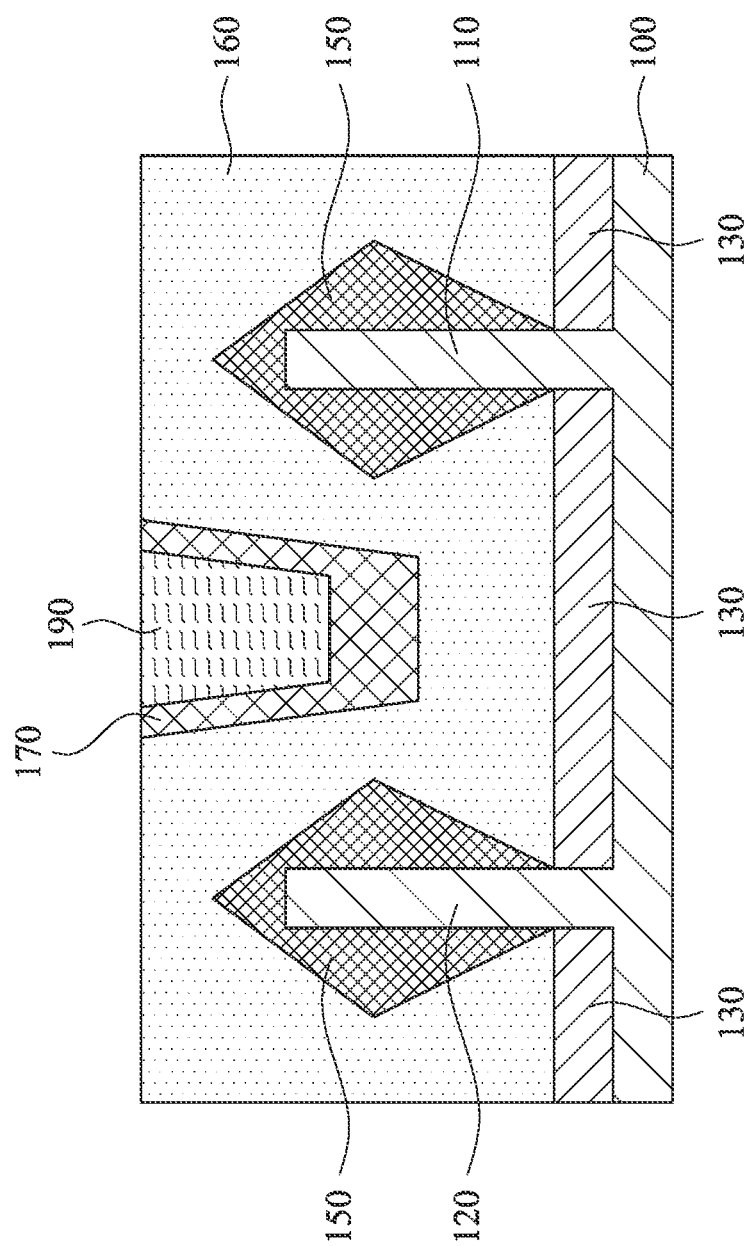
FIG. 1U is a schematic cross-sectional view of the semiconductor device along a line H-H' in FIG. 1R in accordance with some embodiments of the present disclosure.

Referring to FIG. 1R to FIG. 1U, FIG. 1R is a schematic top view of the semiconductor device during a filling operation in accordance with some embodiments of the present disclosure, FIG. 1S is a schematic cross-sectional view of the semiconductor device along a line F-F' in FIG. 1R in accordance with some embodiments of the present disclosure, FIG. 1T is a schematic cross-sectional view of the semiconductor device along a line G-G' in FIG. 1R in accordance with some embodiments of the present disclosure, and FIG. 1U is a schematic cross-sectional view of the semiconductor device along a line H-H' in FIG. 1R in accordance with some embodiments of the present disclosure. After the metal gate cut operation is performed, the filling operation is performed to fill an insulating material in the openings 181 and 183, thereby forming a separation plug 190 in the openings 181 and 183. In some embodiments, the separation plug 190 is formed by CVD, ALD, other suitable operations, and/or a combination thereof. In some embodiments, the insulating material includes a silicon nitride based material. In some embodiments, the silicon nitride based material includes SiN, SiON, SiCN, SiOCN, other suitable materials, and/or a combination thereof. In some embodiments, after the filling operation is performed, a planarization operation is performed (such as CMP). The planarization operation is performed until a top surface of the metal gate structure 140 is exposed.

Figure 2:
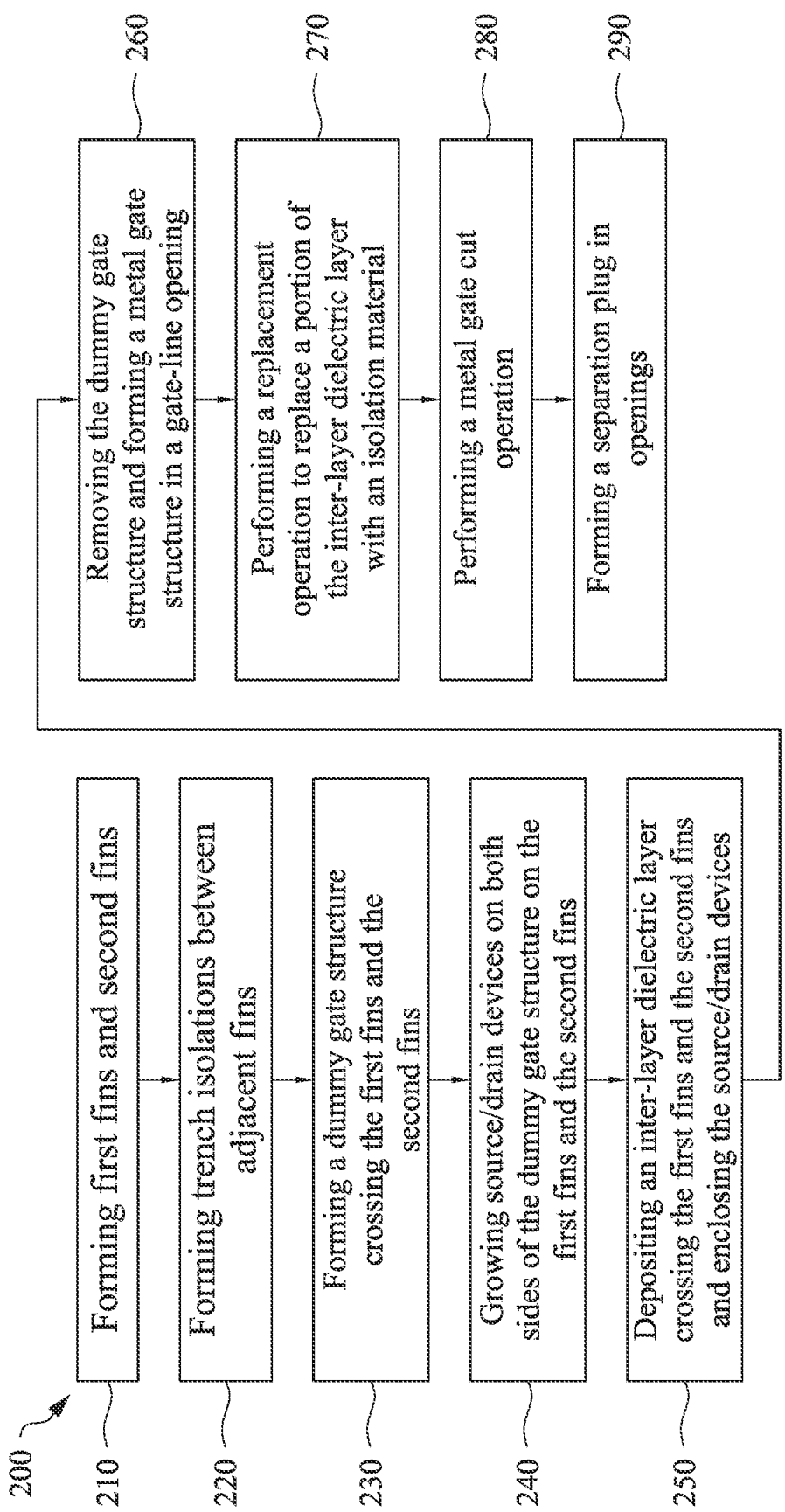
FIG. 2 is a flow chart showing a method for fabrication a semiconductor device according to some embodiments of the present disclosure.

Referring to FIG. 2 together with FIG. 1A to FIG. 1I, FIG. 2 is a flow chart showing a method 200 for fabrication a semiconductor device according to some embodiments of the present disclosure.

At operation 210, first fins 110 and second fins 120 protruding from the substrate are formed, as shown in FIG. 1A. Each of the first fins 110 is divided into a first gate region 110a and a first source/drain region 110b, and the first gate region 110a is located between the first source/drain regions 110b. Similarly, each of the second fins 120 has a second gate region 120a and a second source/drain region 120b adjacent to the second gate region 120a. In some embodiments, the first fins 110 and the second fins 120 are parallel to each other. In some embodiments, the first fins 110 and the second fins 120 are formed from the same material as the substrate. In some embodiments, the first fins 110 and the second fins 120 are formed by etching the substrate.

At operation 220, trench isolations 130 are formed between the first fin 110 and the second fin 120, as shown in FIG. 1B. In some embodiments, the trench isolations 130 include shallow trench isolations, field oxide, local oxidation of silicon, other suitable isolations, and/or a combination thereof. The trench isolation 130 is formed by etching the substrate 100 between the first fin 110 and the second fin 120, thereby forming a recess. Then, a trench isolation material is deposited in the recess, thereby forming the trench isolation 130. In some embodiments, the operation of depositing the trench isolation material is followed by a planarization operation. In some embodiments, the trench isolation material includes low-k dielectric material. In some embodiments, the trench isolation material includes silicon oxide, silicon nitride, silicon oxynitride, fluorine-doped silicate glass (FSG), other suitable isolation materials, and/or a combination thereof.

At operation 230, a dummy gate structure 140a is formed over and around the first gate regions 110a and the second gate regions 120a, and the dummy gate structure 140a extends from the first fin 110 to the adjacent second fin 120, as shown in FIG. 1C. The dummy gate structure 140a includes a dummy gate stack and sidewall spacers 145 formed on sidewalls of the dummy gate stack. The dummy gate stack includes a gate insulating layer 141a and a poly silicon layer 143a formed on the gate insulating layer 141a, and the gate insulating layer 141a is formed on the first gate region 110a and the second gate region 120a. In some embodiments, the gate insulating layer 141a is formed by CVD, PVD, ALD, electron beam (e-beam) evaporation, other suitable operations, and/or a combination thereof. In some embodiments, the gate insulating layer 141a is made from silicon oxide. In some embodiments, the poly silicon layer 143a is formed by a patterning operation. The sidewall spacers 145 include a dielectric material. In some embodiments, the sidewall spacers 145 include silicon oxide, silicon nitride, silicon carbide, silicon carbonitride, silicon oxynitride, silicon oxycarbonitride, other suitable dielectric materials, and/or a combination thereof.

At operation 240, source/drain devices 150 are grown on the first source/drain regions 110b and the second source/drain regions 120b, as shown in FIG. 1D. In some embodiments, the source/drain devices 150 are grown by an epi operation. In some embodiments, the source/drain devices 150 include epitaxially grown silicon (epi Si), silicon carbide or silicon germanium. In some embodiments, the source/drain devices 150 are in-situ doped or undoped during the epi operation. In this embodiment, the source/drain devices 150 are doped during a subsequent operation. In some embodiments, the subsequent doping operation is achieved by an ion implantation, plasma immersion ion implantation, other suitable operations, and/or a combination thereof. In some embodiments, the source/drain devices 150 are further exposed to annealing operations after forming the source/drain devices 150 and/or after the subsequent doping operation.

At operation 250, an ILD layer 160 is deposited between and over the adjacent source/drain devices, as shown in FIG. 1E. In some embodiments, the ILD layer 160 is deposited by CVD, PVD, ALD, high density plasma (HDP) operation, spin-on-dielectric operation, other suitable operations, and/or a combination thereof. The ILD layer 160 is formed from a low-k material. In some embodiments, the ILD layer 160 includes a silane-based insulating material. In some embodiments, the ILD layer 160 includes silicon oxide, silicon nitride, undoped silicate glass (USG), Boro-Silicate Glass (BSG), TEOS, other suitable low-k silane-based materials, and/or a combination thereof. The operation of depositing the ILD layer 160 is followed by a planarization operation, in some embodiments. In this embodiment, the planarization operation includes a chemical mechanical polishing (CMP) operation, other suitable planarization operations, and/or a combination thereof.

At operation 260, the dummy gate structure 140a is removed to form a gate-line opening 140b, and a metal gate structure 140 is deposited in the gate-line opening 140b, as shown in FIG. 1F to FIG. 1H. The gate insulating layer 141a and the poly silicon layer 143a are removed by dry etching operation and/or wet etching operation. The deposited metal gate structure 140 wraps the channel region of the semiconductor device. The metal gate structure includes a dielectric layer 141 and a metal gate layer 143 formed on the dielectric layer 141.

As shown in FIG. 1I, the dielectric layer 141 includes an interfacial layer 141b and a gate dielectric layer 141c formed on the interfacial layer 141b. In some embodiments, the interfacial layer 141b is formed by chemical oxidation, thermal oxidation, ALD, CVD, other suitable operations, and/or a combination thereof. In some embodiments, the interfacial layer 141b includes $SiO_2$, silicon oxynitride, other suitable dielectric materials, and/or a combination thereof. In some embodiments, the gate dielectric layer 141c is formed by ALD, PVD, oxidation, other suitable operations, and/or a combination thereof. In some embodiments, the gate dielectric layer 141c includes silicon dioxide, hafnium oxide ($HfO_2$), $TiO_2$, HfZrO, $Ta_2O_3$, $HfSiO_4$, $ZrO_2$, $ZrSiO_2$, other suitable high-k dielectric materials, and/or a combination thereof.

The metal gate layer 143 includes a barrier layer 143b, a work function adjustment layer 143c formed on the barrier layer 143b, an adhesion layer 143d formed on the work adjustment layer 143c and a main metal layer 143e formed on the adhesion layer 143d. The barrier layer 143b is made of TiN, TaN, TiAlN, TaCN, TaC, TaSiN, other suitable materials, and/or a combination thereof. The work function layer 143c is made of a conductive material. In some embodiments, the work function layer 143c is made of a single layer or a multilayer. In some embodiments, the work function adjustment layer 143c is formed by ALD, PVD, CVD, e-beam evaporation, other suitable processes, and/or a combination thereof. In some embodiments, the work function layer 143c is made of TiN, TaN, TaAlC, TiC, TaC, Co, Al, TiAl, HfTi, TiSi, TaSi, TiAlC, other suitable materials, and/or a combination thereof. The adhesion layer 143d is made of TiN, TaN, TiAlN, TaCN, TaC, TaSiN, other suitable materials, and/or a combination thereof. The main metal layer 143e includes one or more layers of any suitable metal material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or a combination thereof. In some embodiments, the metal gate layer 143 is formed by CVD, PVD, ALD, electroplating, other suitable operations, and/or a combination thereof. In some embodiments, a planarization operation is performed after the metal gate structure 140 is formed.

As shown in FIG. 2 together with FIG. 1J to FIG. 1M, at operation 270, a replacement operation is performed to replace a portion 160a of the ILD layer 160 with an isolation material, thereby forming an isolation portion 170 in the ILD layer 160. In at least one embodiment, the replacement operation is performed by an etching operation and a deposition operation. In some embodiments, the etching operation includes a dry etching, a wet etching, other suitable etching operations, and/or a combination thereof. A patterned hard mask 170a is disposed on the metal gate structure 140 and other portion of the ILD layer 160, thereby exposing the portion 160a of the ILD layer 160, such that the portion 160a of the ILD layer 160 is etched to form an opening 160b by an etchant during the etching operation. In this embodiment, the source/drain devices 150 are not damaged by the etchant. In some embodiments, the source/drain devices are not exposed by the opening 160b during the etching operation. Thereafter, the isolation material is deposited in the opening 160b, thereby forming the isolation portion 170. In some embodiments, the semiconductor structure is further subjected to a planarization operation to remove the isolation material deposited on the metal gate structure 140, such that a top surface of the ILD layer 160, a top surface of the isolation portion 170 and the metal gate structure 140 are coplanar. In some embodiments, a bottom of the isolation portion 170 is elevated higher than the source/drain devices 150. In some embodiments, the isolation material has a lower etching selectivity than materials of the ILD layer 160. In some embodiments, the isolation material includes yttrium silicate ($YSiO_x$), SiN, LaO, W, ZrO, HfO, SiCN, SiC, SiOC, Si, SiB, BN, AlO, WC, Co, MN, other suitable isolation materials, and/or a combination thereof.

As shown in FIG. 2 together with FIG. 1N to FIG. 1Q, at operation 280, a metal gate cut operation is performed on a cut region 180 extending through the metal gate structure 140 to the isolation portion 170, thereby forming a first opening 181 in the metal gate structure 140 and a second opening 183 in the isolation portion 170. A cut region 180 of the metal gate cut operation is located between the first fin 110 and the second fin 120. In some embodiments, the cut region 180 is in the isolation portion 170. In some embodiments, the cut region 180 does not overlap the source/drain devices 150 along a direction perpendicular to the substrate. The metal gate cut operation includes a dry etching, other suitable etching operations, and/or a combination thereof.

As shown in FIG. 1N to FIG. 1P, the metal gate layer 143, the dielectric layer 141 and the trench isolation 130 underlying the cut region 180 are removed by the metal gate cut operation until exposing the trench isolation 130. In some embodiments, a distance of the first depth $H_1$ is substantially greater than heights of the first fin 110 and the second fin 120. As shown in FIG. 1N, FIG. 1O and FIG. 1Q, the isolation portion 170 exposed by a patterned hard mask 180a is removed by the metal gate cut operation, thereby forming the second opening 183. In some embodiments, the ILD layer 160 underlying the isolation portion 170 is not exposed by the second opening 183. In other embodiments, a bottom of the second opening 183 is elevated higher than or coplanar to a bottom of the isolation portion 170. In some embodiments, the source/drain devices 150 are not damaged by the metal gate cut operation. In some embodiments, the source/drain devices 150 are not exposed by the second opening 183. In some embodiments, a bottom of the second opening 183 is elevated higher than the source/drain devices 150.

During the metal gate cut operation, an etchant has a lower etching selectivity with respect to the isolation portion 170 than to the metal gate structure 140, such that a first depth $H_1$ of the first opening 181 is greater than a second depth $H_2$ of the second opening 183. In some embodiments, a ratio of the first depth $H_1$ and the second depth $H_2$ is substantially greater than 1 and smaller than or equal to 10. In some embodiments, the ratio of the first depth $H_1$ and the second depth $H_2$ is substantially greater than 1 and smaller than or equal to 8.5. In some embodiments, the ratio of the first depth $H_1$ and the second depth $H_2$ is substantially greater than 1 and smaller than or equal to 7. If the ratio of the first depth $H_1$ and the second depth $H_2$ is not fallen into the aforementioned range, the source/drain devices 150 are easily damaged by the etchant of the metal gate cut operation, or the critical dimensional requirements cannot be met. For example, the first depth $H_1$ of the first opening 181 is in a range substantially from 120 nm to 220 nm, and the second depth $H_2$ of the second opening 183 is in a range substantially from 50 nm to 150 nm.

Because the etchant of the metal gate cut operation has a lower etching selectivity with respect to the isolation portion 170 than to the metal gate structure 140, the first opening 181 in the metal gate structure 140 has a greater critical dimension (i.e. a critical dimension near a top portion of the opening and along a direction perpendicular to the line C-C' in FIG. 1N) than the second opening 183 in the isolation portion 170. If the first critical dimension $CD_1$ is less than the second critical dimension $CD_2$, the aforementioned second depth $H_2$ of the second opening 183 will be larger than the first depth $H_1$ of the first opening 181, thereby inducing the damages of the source/drain devices 150. For example, the first critical dimension $CD_1$ of the first opening 181 is in a range substantially from 13 nm to 30 nm, and the second critical dimension $CD_2$ of the second opening 183 is in a range substantially from 8 nm to 26 nm. In some embodiments, a difference value between the first critical dimension $CD_1$ and the second critical dimension $CD_2$ is in a range substantially from 1 nm to 15 nm. In some embodiments, the difference value is in a range substantially from 1 nm to 10 nm. In some embodiments, the difference value is in a range substantially from 3 nm to 10 nm. For example, the first critical dimension $CD_1$ of the first opening 181 substantially is 20 nm, and the second critical dimension $CD_2$ of the second opening 183 substantially is 16 nm.

As shown in FIG. 2 together with FIG. 1R to FIG. 1U, at operation 290, an insulating material is filled in the opening 181 and opening 183, thereby forming a separation plug 190. The insulating material includes a silicon nitride based material. In some embodiments, the silicon nitride based material includes SiN, SiON, SiCN, SiOCN, other suitable materials, and/or a combination thereof. In some embodiments, the separation plug 190 is formed by CVD, ALD, other suitable operations, and/or a combination thereof. In some embodiments, after the filling operation is performed, a planarization operation is performed (such as CMP). In some embodiments, the planarization operation is performed until the separation plug 190 and the metal gate structure 140 are coplanar.

It can be understood that some embodiments of the present disclosure provide the method for fabricating the semiconductor device. The replacement operation is performed on the ILD layer with the isolation material, thereby forming the isolation portion in the ILD layer. Accordingly, the isolation portion having a lower etching selectivity than the metal gate structure can blocks the etchant to excessively etch, such that the source/drain devices will not be damaged by the etchant during the sequential metal gate cut operation. Further, it can be understood that some embodiments of the present disclosure provide the semiconductor structure. The ILD layer has the isolation portion having a lower etching selectivity. Therefore, the second opening in the ILD layer has a smaller depth than the first opening in the metal gate structure after the metal gate cut operation. Accordingly, the isolation portion can prevent the source/drain devices from damages induced by the metal gate cut operation.

It is noted that the semiconductor structure and the method for fabricating the semiconductor device are not limited to the above embodiments of present disclosure. The semiconductor structure and the method for fabricating the semiconductor device can be applied in metal gate cut operation.

In accordance with some embodiments of the present disclosure, the present disclosure discloses a method for fabricating a semiconductor device. A first fin and a second fin protruding from a substrate are formed. Next, source/drain devices are grown on both ends of the first fin and both ends of the second fin. Then, an inter-layer dielectric layer crossing the first fin and the second fin and enclosing the source/drain devices is deposited. After the inter-layer dielectric layer is deposited, a metal gate structure that crosses the first fin and the second fin and is enclosed by the inter-layer dielectric layer is formed. The metal gate structure is formed between the source/drain devices. And then, a replacement operation is performed to replace a portion of the inter-layer dielectric layer with an isolation material, thereby forming an isolation portion contacting each of both sides of the metal gate structure between the first fin and the second fin. Thereafter, a metal gate cut operation is performed on a cut region extending through the metal gate structure to the isolation portion, thereby forming a first opening in the metal gate structure and a second opening in the isolation portion. An etchant of the metal gate cut operation has a lower etching selectivity with respect to the isolation portion than to the metal gate structure, such that a first depth of the first opening is greater than a second depth of the second opening. The first opening and the second opening are filled with an insulating material.

In accordance with some embodiments of the present disclosure, the present disclosure discloses a method for fabricating a semiconductor device. Plural fins respectively protruding from a substrate are firstly formed, and trench isolations are formed between every two adjacent fins. Next, a dummy gate structure crossing the fins are formed, and source/drain devices are grown on both sides of the dummy gate structure on the fins. Then, an inter-layer dielectric layers crossing each of the fins on each of both sides of the dummy gate structure and enclosing the source/drain devices is deposited. After the inter-layer dielectric layer is deposited, the dummy gate structure is removed, thereby forming a gate-line opening, and a metal gate structure is deposited in the gate-line opening. And then, a replacement operation is performed to replace plural portions of the inter-layer dielectric layer with an isolation material, thereby forming plural isolation portions respectively contacting each of both sides of the metal gate structure between every two adjacent fins. Thereafter, a metal gate cut operation is performed on a cut region extending through the metal gate structure to adjoined one of the isolation portions until the trench isolation is exposed by a first opening formed in the metal gate structure. An etchant of the metal gate cut operation has a lower etching selectivity with respect to the isolation portion than to the metal gate structure, such that a first depth of the first opening is greater than a second depth of a second opening formed in the isolation portion.

In accordance with some embodiments of the present disclosure, the present disclosure discloses a semiconductor structure. The semiconductor structure comprises a semiconductor substrate, a first fin and a second fin protruding from the semiconductor substrate, plural source/drain devices, a metal gate structure and an inter-layer dielectric layer. The first fin includes a first gate region and a first source/drain region, and the second fin includes a second gate region and a second source/drain region. The source/drain devices are epitaxially grown on the first source/drain region and the second source/drain region. The metal gate structure extends from the first fin to the second fin, and the metal gate structure is over and around the first gate region and the second gate region. The metal gate structure includes a first separation plug between the first fin and the second fin, and the first separation plug has a first depth. The inter-layer dielectric layer is deposited between and over the adjacent source/drain devices. The inter-layer dielectric layer includes an isolation portion including a second separation plug. The second separation plug has a second depth smaller than the first depth, and a bottom of the second separation plug is elevated higher than the source/drain devices.

In some embodiments, a semiconductor structure includes first and second fins, a shallow trench isolation structure, a first gate structure, a second gate structure, first source/drain epitaxial structures, second source/drain epitaxial structures, a separation plug, and an isolation material. The first and second fins extend upwardly from a semiconductor substrate. The shallow trench isolation structure laterally surrounds lower portions of the first and second fins. The first gate structure extends across an upper portion of the first fin. The second gate structure extends across an upper portion of the second fin. The first source/drain epitaxial structures are on the first fin and on opposite sides of the first gate structure. The second source/drain epitaxial structures are on the second fin and on opposite sides of the second gate structure. The separation plug interposes the first and second gate structures and extends along a lengthwise direction of the first fin. The isolation material cups an underside of a portion of the separation plug between one of the first source/drain epitaxial structures and one of the second source/drain epitaxial structures. In some embodiments, the separation plug extends past opposite longitudinal sidewalls of the first gate structure along the lengthwise direction of the first fin. In some embodiments, the separation plug forms a cross-shape profile with the first and second gate structures from a top view. In some embodiments, the separation plug has a top surface coplanar with top surfaces of the first and second gate structures. In some embodiments, the isolation material is spaced apart from the first and second fins. In some embodiments, the isolation material is spaced apart from the shallow trench isolation structure. In some embodiments, the isolation material forms a U-shaped profile from a top view. In some embodiments, the isolation material has a top surface coplanar with top surfaces of the first and second gate structures. In some embodiments, the semiconductor structure includes a gate spacer on a sidewall of the first gate structure, the isolation material being in contact with the gate spacer. In some embodiments, the isolation material has a top surface coplanar with a top surface of the gate spacer.

In some embodiments, a semiconductor structure includes first and second fins, a first gate structure, a second gate structure, first source/drain epitaxial structures, second source/drain epitaxial structures, a separation plug, and an isolation material. The first and second fins extend upwardly from a semiconductor substrate. The first gate structure extends across the first fin. The second gate structure extends across the second fin. The first source/drain epitaxial structures are on the first fin and being spaced at least by the first gate structure. The second source/drain epitaxial structures are on the second fin and being spaced at least by the second gate structure. The separation plug spacing the first gate structure apart from the second gate structures, wherein when viewed in a cross section taken along a lengthwise direction of the first fin, the separation plug having a stepped sidewall structure having an upper sidewall, a lower sidewall laterally set back from the lower sidewall, and intermediary surface connecting the lower sidewall to the upper sidewall. The isolation material lines the upper sidewall and the intermediary surface of the stepped sidewall structure of the separation plug when viewed in the cross section taken along the lengthwise direction of the first fin. In some embodiments, the lower sidewall of the separation plug is free form coverage by the isolation material when viewed in the cross section taken along the lengthwise direction of the first fin. In some embodiments, the separation plug is made of a different material than the isolation material. In some embodiments, wherein the separation plug is made of a metal-containing isolation material. In some embodiments, the isolation material comprises a silicon nitride-containing material.

In some embodiments, a semiconductor structure includes a semiconductor substrate, a first fin and a second fin, a plurality of source/drain structures, a first gate structure and a second gate structure, a first separation plug, and a second separation plug. The first fin and the second fin respectively protrude from the semiconductor substrate, wherein the first fin includes a first gate region and first source/drain regions, and the second fin includes a second gate region and second source/drain regions. The source/drain structures epitaxially grow on the first source/drain regions and the second source/drain regions. The first gate structure and the second gate structure are spectively over the first gate region and the second gate region. The first separation plug is between the first gate structure and the second gate structure and having a first height. The second separation plug is between adjacent two of the plurality of source/drain structures, the second separation plug having a second height less than the first height of the first separation plug. In some embodiments, the first separation plug is made of a same material of the second separation plug. In some embodiments, the second separation plug extends continuously from the first separation plug. In some embodiments, the semiconductor structure further includes an isolation material cupping an underside of the second separation plug but not cupping an underside of the first separation plug. In some embodiments, the semiconductor structure further includes an inter-layer dielectric spacing the plurality of source/drain structures apart from the isolation material, the inter-layer dielectric having a different material than the isolation material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming first and second semiconductor fins upwardly extending from a substrate;
    forming a gate strip extending across the first and second semiconductor fins;
    growing first source/drain regions on the first semiconductor fin and at opposite sides of the gate strip, and second source/drain regions on the second semiconductor fin and at opposite sides of the gate strip;
    depositing a dielectric layer over the first and second source/drain regions;
    forming an isolation material in the dielectric layer and between one of the first source/drain regions and one of the second source/drain regions;
    performing an etching process on the isolation material and the gate strip to form an opening, the opening breaking the gate strip and recessing the isolation material, wherein the etching process uses an etchant that etches the isolation material at a slower etch rate than etching the gate strip; and forming a separation material in the opening.

2. The method of claim 1, wherein after the etching process, from a cross-sectional view taken along a direction in parallel with a lengthwise direction of the gate strip, the isolation material has a profile between the one of the first source/drain regions and the one of the second source/drain regions, and the profile has a horizontal linear portion and two inclined linear portions upwardly extending from opposite two ends of the horizontal linear portion.

3. The method of claim 1, further comprising:

forming a gate spacer on a sidewall of the gate strip, wherein after the etching process, the isolation material has a U-shaped top view profile that has two protrusion portions in contact with the gate spacer.

4. The method of claim 1, wherein the isolation material is spaced apart from the gate strip.

5. The method of claim 1, wherein the separation material has a top surface coplanar with a top surface of the isolation material.

6. The method of claim 1, wherein from a cross-sectional view taken along a lengthwise direction of the first semiconductor fin, the separation material has a first cross-sectional profile breaking the gate strip and non-overlapping with the recessed isolation material and has a second cross-sectional profile on the recessed isolation material.

7. The method of claim 1, wherein the separation material is made of a different material than the isolation material.

8. The method of claim 1, wherein the isolation material comprises yttrium silicate, SiN, LaO, W, ZrO, HfO, SiCN, SiC, SiOC, Si, SiB, BN, AlO, WC, Co AlN, or combinations thereof.

9. The method of claim 1, wherein the separation material comprises nitride.

10. The method of claim 1, wherein a bottom position of the isolation material is lower than a widest position of one of the first source/drain regions.

11. A method, comprising:

forming first and second semiconductor fins on a substrate;

forming a first gate structure extending across the first semiconductor fin, and a second gate structure extending across the second semiconductor fin;

forming first source/drain structures on the first semiconductor fin and at opposite sides of the first gate structure, and second source/drain structures on the second semiconductor fin and at opposite sides of the second gate structure;

forming an isolation material between one of the first source/drain structures and one of the second source/drain structures, the isolation material having a bottom position higher than a bottom position of the one of the first source/drain structures and a bottom position of the one of the second source/drain structures; and after forming the isolation material, forming a separation structure interposing the first and second gate structures, wherein the separation structure forms a cross-shaped top view profile with the first and second gate structures, and has a first cross-sectional profile between the first and second gate structures and a second cross-sectional profile between the one of the first source/drain structures and the one of the second source/drain structures, the first cross-sectional profile having a greater vertical dimension than the second cross-sectional profile, and the isolation material overlaps with the second cross-sectional profile of the separation structure and non-overlaps with the first cross-sectional profile of the separation structure.

12. The method of claim 11, wherein the separation structure has a top surface coplanar with top surfaces of the first and second gate structures.

13. The method of claim 11, wherein the isolation material has a top surface coplanar with top surfaces of the first and second gate structures.

14. The method of claim 11, further comprising:

forming a shallow trench isolation structure laterally surrounding lower portions of the first and second semiconductor fins, wherein the isolation material is spaced apart from the shallow trench isolation structure.

15. A method, comprising:

forming first and second channel patterns on a semiconductive substrate;

forming a gate strip extending across the first and second channel patterns;

forming a plurality of first source/drain patterns on the first channel pattern and at opposite sides of the gate strip, and a plurality of second source/drain patterns on the second channel pattern and at opposite sides of the gate strip;

forming a dielectric layer over the first and second source/drain patterns and laterally surrounding the gate strip;

forming an isolation material in the dielectric layer and between one of the first source/drain patterns and one of the second source/drain patterns, wherein the isolation material has a U-shaped top view profile;

patterning the gate strip to form a first gate pattern across the first channel pattern, and a second gate pattern across the second channel pattern; and forming a separation plug having a first separation portion between the first and second gate patterns and a second separation portion between the one of the first source/drain patterns and the one of the second source/drain patterns, wherein from a cross-sectional view taken along a direction in parallel with a lengthwise direction of the gate strip, the isolation material cups an underside of the second separation portion and has a profile between the one of the first source/drain patterns and the one of the second source/drain patterns, and the profile has a horizontal linear portion and two inclined linear portions upwardly extending from opposite two ends of the horizontal linear portion.

16. The method of claim 15, wherein the isolation material does not overlap with the first separation portion.

17. The method of claim 15, wherein a bottom position of the isolation material is lower than a widest position of one of the first source/drain patterns.

18. The method of claim 15, further comprising:

forming a shallow trench isolation structure laterally surrounding lower portions of the first and second channel patterns, wherein the isolation material is spaced apart from the shallow trench isolation structure.

19. The method of claim 15, wherein the separation plug extends past opposite longitudinal sidewalls of the first gate pattern along a lengthwise direction of the first channel pattern from a top view.

20. The method of claim 15, further comprising:
forming a gate spacer on a sidewall of the gate strip, wherein the U-shaped top view profile of the isolation material has two protrusion portions in contact with the gate spacer.

\* \* \* \* \*